US010230146B2

(12) United States Patent
Cruickshank et al.

(10) Patent No.: US 10,230,146 B2
(45) Date of Patent: *Mar. 12, 2019

(54) RARE EARTH REDUCED GARNET SYSTEMS AND RELATED MICROWAVE APPLICATIONS

(71) Applicant: Skyworks Solutions, Inc., Woburn, MA (US)

(72) Inventors: David Bowie Cruickshank, Rockville, MD (US); Rickard Paul O'Donovan, Dunmanway (IE); Iain Alexander MacFarlane, Midleton (IE); Brian Murray, Belgooly (IE); Michael David Hill, Frederick, MD (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/003,446

(22) Filed: Jan. 21, 2016

(65) Prior Publication Data

US 2016/0226120 A1    Aug. 4, 2016

Related U.S. Application Data

(63) Continuation of application No. 13/484,018, filed on May 30, 2012, now Pat. No. 9,263,175.
(Continued)

(51) Int. Cl.
*H01F 10/24*  (2006.01)
*H01P 1/387*  (2006.01)
(Continued)

(52) U.S. Cl.
CPC .............. *H01P 1/387* (2013.01); *H01F 1/346* (2013.01); *H01F 10/24* (2013.01); *C30B 29/28* (2013.01)

(58) Field of Classification Search
CPC ........... H01P 1/207; H01P 1/387; H01F 10/24
(Continued)

(56) References Cited

U.S. PATENT DOCUMENTS 3,268,452 A    8/1966  Seymour
3,429,740 A *  2/1969  Mee .................... C04B 35/2675
                                                257/183
(Continued)

FOREIGN PATENT DOCUMENTS

CN      1054503     9/1991
CN      1239579     12/1999
(Continued)

OTHER PUBLICATIONS

International Search Report dated May 17, 2012 in connection with related PCT Application No. PCT/US2011/061733 (WO 2012/074821).
(Continued)

*Primary Examiner* — Dean Takaoka
*Assistant Examiner* — Alan Wong
(74) *Attorney, Agent, or Firm* — Knobbe, Martens Olson & Bear, LLP

(57) ABSTRACT

Disclosed are synthetic garnets and related devices that can be used in radio-frequency (RF) applications. In some embodiments, such RF devices can include garnets having reduced or substantially nil Yttrium or other rare earth metals. Such garnets can be configured to yield high dielectric constants, and ferrite devices, such as TM-mode circulators/isolators, formed from such garnets can benefit from reduced dimensions. Further, reduced or nil rare earth content of such garnets can allow cost-effective fabrication of ferrite-based RF devices. In some embodiments, such ferrite devices can include other desirable properties such as low
(Continued)

magnetic resonance linewidths. Examples of fabrication methods and RF-related properties are also disclosed.

20 Claims, 25 Drawing Sheets

Related U.S. Application Data

(60) Provisional application No. 61/493,942, filed on Jun. 6, 2011, provisional application No. 61/648,892, filed on May 18, 2012.

(51) Int. Cl.
*H01F 1/34* (2006.01)
*C30B 29/28* (2006.01)

(58) Field of Classification Search
USPC ............ 333/1.1, 201, 202, 219.2; 252/62.57
See application file for complete search history.

(56) References Cited

U.S. PATENT DOCUMENTS

| | | | |
|---|---|---|---|
| 3,688,282 A | | 8/1972 | Buhrer |
| 3,838,450 A | | 9/1974 | Bongers et al. |
| 4,002,803 A | | 1/1977 | Blank |
| 4,034,358 A | | 7/1977 | Blank |
| 4,165,410 A | | 8/1979 | Blank |
| 4,419,417 A | | 12/1983 | Le Craw et al. |
| 5,709,811 A | * | 1/1998 | Satoh ................ H01F 1/346 252/62.57 |
| 5,879,824 A | * | 3/1999 | Fujino .................. H01F 10/245 252/62.57 |
| 6,235,221 B1 | | 5/2001 | Suzuki et al. |
| 6,437,654 B2 | * | 8/2002 | Maruhashi ............. H01P 1/387 333/1.1 |
| 8,696,925 B2 | | 4/2014 | Cruickshank |
| 2002/0039555 A1 | | 4/2002 | Matsunaga et al. |
| 2005/0128023 A1 | | 6/2005 | Takahashi et al. |
| 2006/0170513 A1 | | 8/2006 | Mazzochette et al. |
| 2009/0260861 A1 | | 10/2009 | Nakajima et al. |
| 2014/0021418 A1 | | 1/2014 | Shiroki |

FOREIGN PATENT DOCUMENTS

| | | |
|---|---|---|
| CN | 1310349 | 8/2001 |
| CN | 1339847 A | 3/2002 |
| CN | 101187063 | 5/2008 |
| CN | 101304960 | 11/2008 |
| JP | S47-15699 A | 8/1972 |
| JP | S51-18897 | 2/1976 |
| JP | S48-22639 B | 7/1976 |
| JP | H09-171918 | 6/1997 |
| JP | H11-154805 A | 6/1999 |
| JP | H11-154806 A | 6/1999 |
| JP | 2002-064013 | 2/2002 |
| JP | 2007-274281 A | 10/2007 |
| KR | 10-0391758 B1 | 7/2003 |
| WO | WO 2007/052809 | 5/2007 |

OTHER PUBLICATIONS

English Translation of First Office Action issued in Chinese Patent Application No. 201180066382.2, dated Jul. 9, 2014, in 7 pages.
English Translation of Taiwanese Search Report, issued in Application No. 100144013, dated Jan. 14, 2014, in 1 page.
Extended European search report re Application No. 12796601.8, dated Aug. 14, 2014, in 5 pages.
Extended European search report re Application No. 11844685.5, dated Aug. 21, 2014, in 5 pages.
International Search Report and Written Opinion re International Application No. PCT/US2012/040041, dated Feb. 18, 2013, in 10 pages.
Second Office Action for Chinese Patent Application No. 201180066382.2, dated Mar. 31, 2015.
EP Search Report and the Written Opinion for European Patent Application No. 11844685.5, dated Sep. 1, 2014.
Office Action for ROC (Taiwan) Pat. Appln. No. 103117 406, dated Jul. 16, 2015.
Siao et al., "Dielectric relaxation and magnetic behavior of bismuth-substitued yttrium iron garner", Mar. 25, 2011, Journal of Applied Physics 109, 07A508.

* cited by examiner $Bi_{0.9}Ca_{0.9+2x}Y_{1.2-2x}Zr_{0.7}Nb_{0.1}V_xFe_{4.2-x}O_{12}, V=0.6$

RARE EARTH REDUCED GARNET SYSTEMS AND RELATED MICROWAVE APPLICATIONS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure generally relates to synthetic garnet systems and related radio-frequency (RF) applications.

Description of the Related Art

Various crystalline materials with magnetic properties have been used as components in electronic devices such as cellular phones, biomedical devices, and RFID sensors. Garnets are crystalline materials with ferrimagnetic properties particularly useful in RF electronics operating in the lower frequency portions of the microwave region. Many microwave magnetic materials are derivatives of Yttrium Iron Garnet (YIG), a synthetic form of garnet widely used in various telecommunication devices largely because of its favorable magnetic properties such as narrow line absorption at its ferromagnetic resonance frequency. YIG is generally composed of Yttrium, Iron, Oxygen, and possibly doped with one or more other rare earth metals such as the Lanthanides or Scandium. However, the supply of rare earth elements such as Yttrium has recently become increasingly restricted, thus resulting in correspondingly steep increases in cost. As such, there is a need to find a cost-effective substitute for rare earth elements in synthetic garnet structures that does not compromise the magnetic properties of the material and can be used for microwave applications.

SUMMARY

The compositions, materials, methods of preparation, devices, and systems of this disclosure each have several aspects, no single one of which is solely responsible for its desirable attributes. Without limiting the scope of this invention, its more prominent features will now be discussed briefly.

Any terms not directly defined herein shall be understood to have all of the meanings commonly associated with them as understood within the art. Certain terms are discussed below, or elsewhere in the specification, to provide additional guidance to the practitioner in describing the compositions, methods, systems, and the like of various embodiments, and how to make or use them. It will be appreciated that the same thing may be said in more than one way. Consequently, alternative language and synonyms may be used for any one or more of the terms discussed herein. No significance is to be placed upon whether or not a term is elaborated or discussed herein. Some synonyms or substitutable methods, materials and the like are provided. Recital of one or a few synonyms or equivalents does not exclude use of other synonyms or equivalents, unless it is explicitly stated. Use of examples in the specification, including examples of terms, is for illustrative purposes only and does not limit the scope and meaning of the embodiments herein.

Embodiments disclosed herein include methods for modifying synthetic garnets used in RF applications to reduce or eliminate Yttrium (Y) or other rare earth metals in the garnets without adversely affecting the magnetic properties of the material. In some embodiments, modified synthetic garnet compositions with significantly reduced rare earth content are designed with properties suitable for use as ferrite materials in devices such as isolators and circulators, which are necessary components in all cellular base stations.

Some embodiments include methods of substituting at least some of the Yttrium (Y) in a garnet structure with other chemicals, such as a combination of Bismuth and one or more high valency ions. The substitute chemicals are selected to reduce the content of Y without adversely affecting the performance of the material. The rare earth substitutions described herein substantially reduce the need for Yttrium Oxides in the synthesis of certain garnet structures such as Yttrium Iron Garnets (YIG), and provide modified crystalline materials useful in a variety of electronic applications including but not limited to uses in devices for cellular base stations.

In one embodiment, the method for modifying synthetic garnets comprises substituting Bismuth (Bi) for some of the Yttrium (Y) on the dodecahedral sites of the garnet structure and introducing high valency non-magnetic ions, preferably greater than +3, to the octahedral sites to replace some of the Iron (Fe) in the garnet. The quantity and combination of substitute ions and processing techniques are selected to ensure that the resulting material has high magnetization with low linewidth, along with reduced Yttrium (Y) content. In some embodiments, Calcium (Ca) is also introduced to the dodecahedral sites of the garnet structure for charge compensation induced by the high valency ions while at the same time replace some or all of the remaining Yttrium (Y). In some other embodiments, the method further comprises introducing one or more high valency ions, such as Vanadium ($V^{5+}$), to the tetrahedral sites of the garnet structure to further reduce the saturation magnetization of the resulting material.

In one implementation, the modified synthetic crystalline material is represented by the formula $Bi_xCa_{y+2x}Y_{1-x-y-2z}Fe_{5-y-z}Zr_yV_zO_{12}$, wherein x is greater than or equal to 0.5 and less than or equal to 1.4, y is greater than or equal to 0.3 and less than or equal to 0.55, and z is greater than or equal to 0 or less than or equal to 0.6. Bi and Ca are placed on the dodecahedral sites, Zr is placed on the octahedral sites, and V is placed on the tetrahedral sites. In some versions, small amounts of Niobium (Nb) may be placed on the octahedral site and small amounts of Molybdenum (Mo) on the tetrahedral site. Preferably, the modified crystalline material has a magnetic resonance linewidth of less than or equal to 11 Oersted.

In another embodiment, the modified synthetic crystalline material is represented by the formula $Bi(Y,Ca)_2Fe_{4.2}M^I_{0.4}M^{II}_{0.4}O_{12}$, where $M^I$ is the octahedral substitution for Fe and can be selected from the group consisting of In, Zn, Mg, Zr, Sn, Ta, Nb, Fe, Ti, Sb, and combinations thereof where $M^{II}$ is the tetrahedral substitution for Fe and can be selected from the group consisting of: Ga, W, Mo, Ge, V, Si, and combinations thereof.

In yet another implementation, the modified synthetic crystalline material is represented by the formula $Bi_{0.9}Ca_{0.9x}Y_{2.1-0.9x}(Zr_{0.7}Nb_{0.1})_xFe_{5-0.8x}O_{12}$, wherein x is greater than or equal to 0.5 and less than or equal to 1.0.

In yet another implementation, the modified synthetic crystalline material is represented by the formula $Bi_xY_{3-x-0.35}Ca_{0.35}Zr_{0.35}Fe_{4.65}O_{12}$, where x is greater than or equal to 0.5 and less than or equal to 1.0, more preferably x is greater or equal to 0.6 and less than or equal to 0.8.

In yet another implementation, the modified synthetic crystalline material is represented by the formula $Y_{2.15-2x}Bi_{0.5}Ca_{0.35+2x}Zr_{0.35}V_xFe_{4.65-x}O_{12}$, wherein x is greater than or equal to 0.1 and less than or equal to 0.8.

In yet another implementation, a modified Yttrium based garnet structure is provided. The modified Yttrium based garnet structure comprises Bismuth ($Bi^{3+}$) and Calcium ($Ca^{2+}$) doped dodecahedral sites, and tetravalent or pentavalent ion doped octahedral sites, wherein $Bi^{3+}$ occupies about 0 to 100 atomic percent of the dodecahedral sites, $Ca^{2+}$ occupies about 0 to 90 atomic percent of the dodecahedral sites, wherein the tetravalent or pentavalent ions occupy about 0 to 50 atomic percent of the octahedral sites, wherein said modified synthetic Yttrium based garnet structure has a magnetic resonance linewidth of between 0 and 50 Oersteds. In some implementations, the modified Yttrium based garnet structure further comprises Vanadium ($V^{5+}$) doped tetrahedral sites, wherein $V^{5+}$ occupies about 0 to 50 atomic percent of the tetrahedral sites. Preferably, Yttrium occupies the balance of the dodecahedral sites of the modified Yttrium based garnet structure. In some implementations, the modified Yttrium based garnet structure is incorporated as a ferrite material in RF devices such isolators, circulators, or resonators.

Advantageously, the substitution allows the use of tetravalent, pentavalent, and other ions on the octahedral site of the garnet structure, resulting in potentially high magnetization with low linewidth, along with reduced Y content.

In some implementations, the present disclosure relates to a synthetic garnet material having a structure including dodecahedral sites, with Bismuth occupying at least some of the dodecahedral sites. The garnet material has a dielectric constant value of at least 21.

In some embodiments, the dielectric constant value can be in a range of 25 to 32. In some embodiments, the garnet can be represented by the formula $Bi_{3-x}(RE\ or\ Ca)_xFe_{2-y}(Me)_yFe_{3-z}(Me')_zO_{12}$ where x is greater than or equal to 1.6 and less than or equal to 2.0, RE represents a rare earth element, and each of Me and Me' represents a metal element. The value of x can be approximately 1.6. The metal element Me can include Zr and the value of y can be greater than or equal to 0.35 and less than or equal to 0.75. The value of y can be approximately 0.55. The metal element Me' can include V and the value of z can be greater than or equal to 0 and less than or equal to 0.525. The value of z can be approximately 0.525 such that the garnet is substantially free of rare earth and the formula is $Bi_{1.4}Ca_{1.6}Zr_{0.55}V_{0.525}Fe_{3.925}O_{12}$. For such an example composition, the dielectric constant value can be approximately 27. In some embodiments, the garnet material can have a ferrimagnetic resonance linewidth value that is less than 12 Oersted.

According to a number of implementations, the present disclosure relates to a method for fabricating synthetic garnet material having dodecahedral sites, octahedral sites, and tetrahedral sites. The method includes introducing Bismuth into at least some of the dodecahedral sites. The method further includes introducing high-polarization ions into at least some of either or both of the octahedral and tetrahedral sites to yield a dielectric constant value of at least 21 for the garnet material.

In some embodiments, the high-polarization ions can include non-magnetic ions. The non-magnetic ions can include Zirconium in octahedral sites in concentration selected to maintain a low magnetic resonance linewidth. The magnetic resonance linewidth can be less than or equal to 12 Oersted. The non-magnetic ions can include Vanadium in tetrahedral sites.

In some embodiments, the dielectric constant value can be in a range of 25 to 32. In some embodiments, the introduction of Bismuth and high-polarization ions can result in the garnet material being substantially free of rare earth.

In a number of implementations, the present disclosure can include a circulator that includes a conductor having a plurality of signal ports. The circulator further includes one or more magnets configured to provide a magnetic field. The circulator further includes one or more ferrite disks disposed relative to the conductor and the one or more magnets so that a radio-frequency (RF) signal is routed selectively among the signal ports due to the magnetic field. Each of the one or more ferrite disks has an enhanced dielectric constant value of at least 21 and at least some garnet structures. The garnet structures include dodecahedral sites, and at least some of the dodecahedral sites are occupied by Bismuth.

In some embodiments, the garnet structures can be substantially free of Yttrium. In some embodiments, the garnet structures can be substantially free of rare earth elements.

In some embodiments, the ferrite disk can be a circular shaped disk. In some embodiments, the circular shaped ferrite disk can have a diameter that is reduced by a factor of square root of $(\varepsilon/\varepsilon')$, where $\varepsilon$ is the dielectric constant in a range of 14 to 16, and $\varepsilon'$ is the enhanced dielectric constant. In some embodiments, the circulator can be a transverse magnetic (TM) mode device.

In accordance with some implementations, the present disclosure relates to a packaged circulator module that includes a mounting platform configured to receive one or more components thereon. The packaged circulator module further includes a circulator device mounted on the mounting platform. The circulator device includes a conductor having a plurality of signal ports. The circulator device further includes one or more magnets configured to provide a magnetic field. The circulator further includes one or more ferrite disks disposed relative to the conductor and the one or more magnets so that a radio-frequency (RF) signal is routed selectively among the signal ports due to the magnetic field. Each of the one or more ferrite disks has an enhanced dielectric constant value of at least 21 and at least some garnet structures. The garnet structures include dodecahedral sites and at least some thereof occupied by Bismuth. The packaged circulator module further includes a housing mounted on the mounting platform and dimensioned to substantially enclose and protect the circulator device.

In some implementations, the present disclosure relates to a radio-frequency (RF) circuit board that includes a circuit substrate configured to receive a plurality of components. The circuit board further includes a plurality of circuits disposed on the circuit substrate and configured to process RF signals. The circuit board further includes a circulator device disposed on the circuit substrate and interconnected with at least some of the circuits. The circulator device includes a conductor having a plurality of signal ports. The circulator device further includes one or more magnets configured to provide a magnetic field. The circulator further includes one or more ferrite disks disposed relative to the conductor and the one or more magnets so that a radio-frequency (RF) signal is routed selectively among the signal ports due to the magnetic field. Each of the one or more ferrite disks has an enhanced dielectric constant value of at least 21 and at least some garnet structures. The garnet structures include dodecahedral sites and at least some thereof occupied by Bismuth. The circuit board further includes a plurality of connection features configured to facilitate passing of the RF signals to and from the RF circuit board.

According to some implementations, the present disclosure relates to a radio-frequency (RF) system that includes an antenna assembly configured to facilitate transmission and reception of RF signals. The system further includes a transceiver interconnected to the antenna assembly and configured to generate a transmit signal for transmission by the antenna assembly and process a received signal from the antenna assembly. The system further includes a front end module configured to facilitate routing of the transmit signal and the received signal. The front end module includes one or more circulators, with each circulator including a conductor having a plurality of signal ports. The circulator further includes one or more magnets configured to provide a magnetic field. The circulator further includes one or more ferrite disks disposed relative to the conductor and the one or more magnets so that a radio-frequency (RF) signal is routed selectively among the signal ports due to the magnetic field. Each of the one or more ferrite disks had an enhanced dielectric constant value of at least 21 and at least some garnet structures. The garnet structures include dodecahedral sites and at least some thereof occupied by Bismuth.

In some embodiments, the system can include a base station. In some embodiments, the base station can include a cellular base station.

DETAILED DESCRIPTION OF SOME EMBODIMENTS

The headings provided herein, if any, are for convenience only and do not necessarily affect the scope or meaning of the claimed invention.

Figure 1:
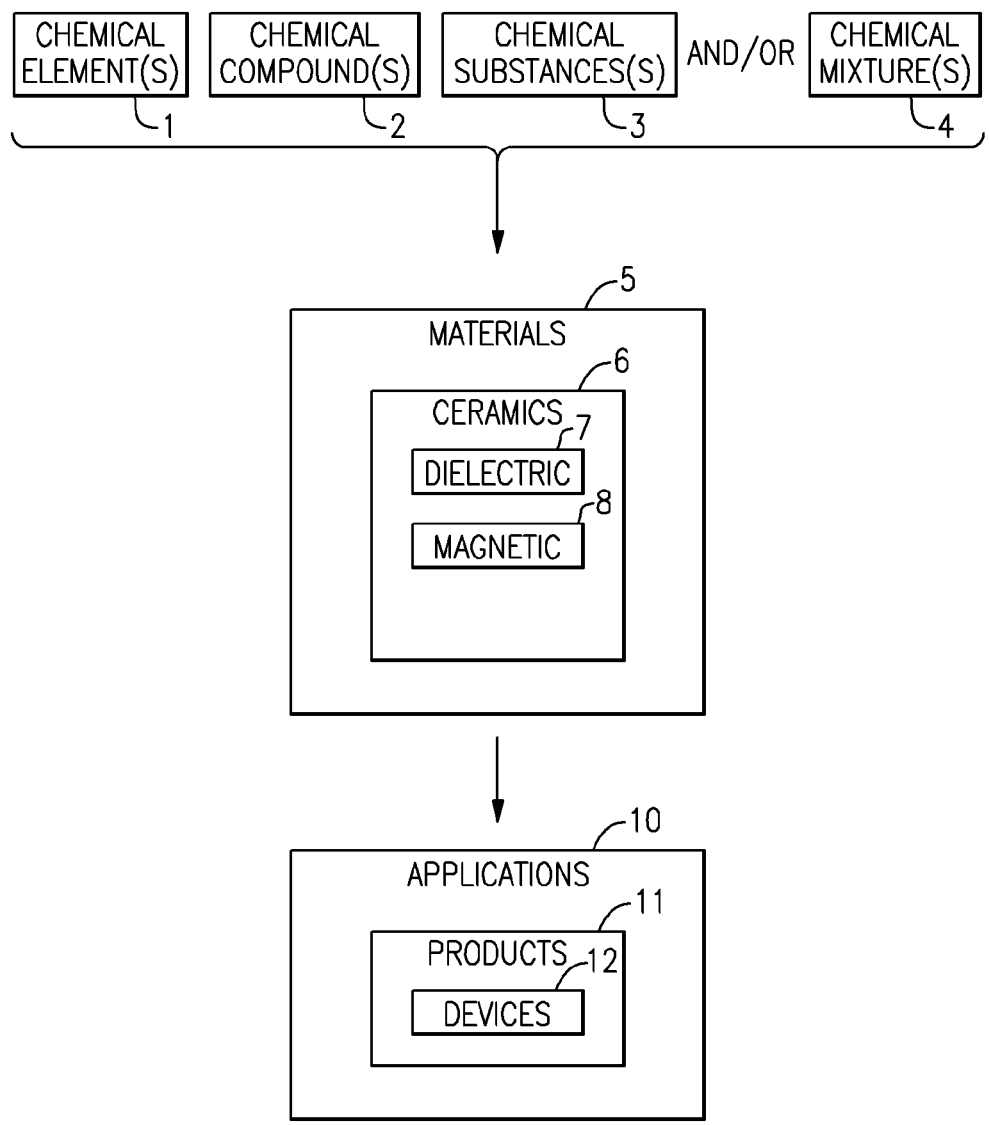
FIG. 1 schematically shows how materials having one or more features described herein can be designed, fabricated, and used.

FIG. 1 schematically shows how one or more chemical elements (block 1), chemical compounds (block 2), chemical substances (block 3) and/or chemical mixtures (block 4) can be processed to yield one or more materials (block 5) having one or more features described herein. In some embodiments, such materials can be formed into ceramic materials (block 6) configured to include a desirable dielectric property (block 7), a magnetic property (block 8) and/or an advanced material property (block 9).

In some embodiments, a material having one or more of the foregoing properties can be implemented in applications (block 10) such as radio-frequency (RF) application. Such applications can include implementations of one or more features as described herein in devices 12. In some applications, such devices can further be implemented in products 11. Examples of such devices and/or products are described herein.

Disclosed herein are methods of modifying synthetic garnet compositions, such as Yttrium Iron Garnet (YIG), to reduce or eliminate the use of rare earth metals in such compositions. Also disclosed herein are synthetic garnet materials having reduced or no rare earth metal content, methods of producing the materials, and the devices and systems incorporating such materials. The synthetic garnet materials prepared according to embodiments described in the disclosure exhibit favorable magnetic properties for microwave magnetic applications. These favorable properties include but are limited to low magnetic resonance line width, optimized density, saturation magnetization and dielectric loss tangent. Applicants have surprisingly found that when garnet compositions are doped with certain combinations of ions and prepared using certain processing techniques, a significant amount if not all of the rare earth elements can be substituted and yet still result in microwave magnetic crystalline materials with comparable, if not superior, performance characteristics as commercially available garnets containing Yttrium (Y) or other rare earth elements.

Figure 2:
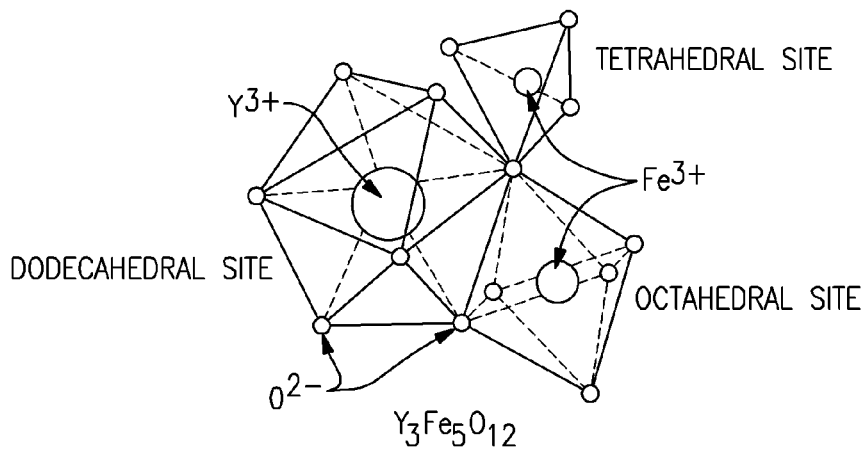
FIG. 2 depicts a Yttrium based garnet crystal lattice structure.

Synthetic garnets typically have the formula unit of $A_3B_5O_{12}$, where A and B are trivalent metal ions. Yttrium Iron Garnet (YIG) is a synthetic garnet having the formula unit of $Y_3Fe_5O_{12}$, which includes Yttrium (Y) in the 3+ oxidation state and Iron (Fe) in the 3+ oxidation state. The crystal structure of a YIG formula unit is depicted in FIG. 2. As shown in FIG. 2, YIG has a dodecahederal site, an octahedral site, and a tetrahedral site. The Y ions occupy the dodecahedral site while the Fe ions occupy the octahedral and tetrahedral sites. Each YIG unit cell, which is cubic in crystal classifications, has eight of these formula units.

The modified synthetic garnet compositions, in some embodiments, comprise substituting some or all of the Yttrium (Y) in Yttrium Iron Garnets (YIG) with a combination of other ions such that the resulting material maintains desirable magnetic properties for microwave applications. There have been past attempts toward doping YIG with different ions to modify the material properties. Some of these attempts, such as Bismuth (Bi) doped YIG, are described in "Microwave Materials for Wireless Applications" by D. B. Cruickshank, which is hereby incorporated by reference in its entirety. However, in practice ions used as substitutes may not behave predictably because of, for example, spin canting induced by the magnetic ion itself or by the effect of non-magnetic ions on the environment adjacent magnetic ions, reducing the degree alignment. Thus, the resulting magnetic properties cannot be predicted. Additionally, the amount of substitution is limited in some cases. Beyond a certain limit, the ion will not enter its preferred lattice site and either remains on the outside in a second phase compound or leaks into another site. Additionally, ion size and crystallographic orientation preferences may compete at high substitution levels, or substituting ions are influenced by the ion size and coordination of ions on other sites. As such, the assumption that the net magnetic behavior is the sum of independent sub-lattices or single ion anisotropy may not always apply in predicting magnetic properties.

Considerations in selecting an effective substitution of rare earth metals in YIG for microwave magnetic applications include the optimization of the density, the magnetic resonance linewidth, the saturation magnetization, the Curie temperature, and the dielectric loss tangent in the resulting modified crystal structure. Magnetic resonance is derived from spinning electrons, which when excited by an appropriate radio frequency (RF) will show resonance proportional to an applied magnetic field and the frequency. The width of the resonance peak is usually defined at the half power points and is referred to as the magnetic resonance linewidth. It is generally desirable for the material to have a low linewidth because low linewidth manifests itself as low magnetic loss, which is required for all low insertion loss ferrite devices. The modified garnet compositions according to preferred embodiments of the present invention provide single crystal or polycrystalline materials with reduced Yttrium content and yet maintaining low linewidth and other desirable properties for microwave magnetic applications.

In some embodiments, a Yttrium based garnet is modified by substituting Bismuth ($Bi^{3+}$) for some of the Yttrium ($Y^{3+}$) on the dodecahedral sites of the garnet structure in combination with introducing one or more ions, such as divalent (+2), trivalent (+3), tetravalent (+4), pentavalent (+5) or hexavalent (+6) non-magnetic ions to the octahedral sites of the structure to replace at least some of the Iron ($Fe^{3+}$). In a preferred implementation, one or more high valency non-magnetic ions such as Zirconium ($Zr^{4+}$) or Niobium ($Nb^{5+}$) can be introduced to the octahedral sites.

In some embodiments, a Yttrium based garnet is modified by introducing one or more high valency ions with an oxidation state greater than 3+ to the octahedral or tetrahedral sites of the garnet structure in combination with substituting Calcium ($Ca^{2+}$) for Yttrium ($Y^{3+}$) in the dodecahedral site of the structure for charge compensation induced by the high valency ions, hence reducing the $Y^{3+}$ content. When non-trivalent ions are introduced, valency balance is maintained by introducing, for example, divalent Calcium ($Ca^{2+}$) to balance the non-trivalent ions. For example, for each 4+ ion introduced to the octahedral or tetrahedral sites, one $Y^{3+}$ ion is substituted with a $Ca^{2+}$ ion. For each 5+ ion, two $Y^{3+}$ ions are replaced by $Ca^{2+}$ ions. For each 6+ ion, three $Y^{3+}$ ions are replaced by $Ca^{2+}$ ions. For each 6+ ion, three $Y^{3+}$ ions are replaced by $Ca^{2+}$ ions. In one implementation, one or more high valence ions selected from the group consisting of $Zr^{4+}$, $Sn^{4+}$, $Ti^{4+}$, $Nb^{5+}$, $Ta^{5+}$, $Sb^{5+}$, $W^{6+}$, and $Mo^{6+}$ is introduced to the octahedral or tetrahedral sites, and divalent Calcium ($Ca^{2+}$) is used to balance the charges, which in turn reduces $Y^{3+}$ content.

In some embodiments, a Yttrium based garnet is modified by introducing one or more high valency ions, such as Vanadium ($V^{5+}$), to the tetrahedral site of the garnet structure to substitute for $Fe^{3+}$ to further reduce the magnetic resonance linewidth of the resulting material. Without being bound by any theory, it is believed that the mechanism of ion substitution causes reduced magnetization of the tetrahedral site of the lattice, which results in higher net magnetization of the garnet, and by changing the magnetocrystalline environment of the ferric ions also reduces anisotropy and hence the ferromagnetic linewidth of the material.

In some embodiments, Applicant has found that a combination of high Bismuth (Bi) doping combined with Vanadium (V) and Zirconium (Zr) induced Calcium (Ca) valency compensation could effectively displace all or most of the Yttrium (Y) in microwave device garnets. Applicants also have found that certain other high valency ions could also be used on the tetrahedral of octahedral sites and that a fairly high level of octahedral substitution in the garnet structure is preferred in order to obtain magnetic resonance linewidth in the 5 to 20 Oersted range. Moreover, Yttrium displacement is preferably accomplished by adding Calcium in addition to Bismuth to the dodecahedral site. Doping the octahedral or tetrahedral sites with higher valency ions, preferably greater than 3+, would allow more Calcium to be introduced to the dodecahedral site to compensate for the charges, which in turn would result in further reduction of Yttrium content.

Modified Synthetic Garnet Compositions:

In one implementation, the modified synthetic garnet composition may be represented by general Formula I: $Bi_xCa_{y+2x}Y_{1-x-y-2z}Fe_{5-y-z}Zr_yV_zO_{12}$, where x=0 to 3, y=0 to 1, and z=0 to 1.5, more preferably x=0.5 to 1.4, y=0.3 to 0.55, and z=0 to 0.6. In a preferred implementation, 0.5 to 1.4 formula units of Bismuth (Bi) is substituted for some of the Yttrium (Y) on the dodecahedral site, 0.3 to 0.55 formula units of Zirconium (Zr) is substituted for some of the Iron (Fe) on the octahedral site. In some embodiments, up to 0.6 formula units of Vanadium (V) is substituted for some of the Iron (Fe) on the tetrahedral site. Charge balance is achieved by Calcium (Ca) substituting for some or all of the remaining Yttrium (Y). In some other embodiments, small amounts of Niobium (Nb) may be placed on the octahedral site and small amounts of Molybdenum (Mo) may be placed on the tetrahedral site.

In another implementation, the modified synthetic garnet composition may be represented by general Formula II: $Bi_xY_{3-x-0.35}Ca_{0.35}Zr_{0.35}Fe_{4.65}O_{12}$, where x=0.5 to 1.0, preferably x=0.6 to 0.8, more preferably x=0.5. In this implementation, 0.5 to 1.0 formula units of Bismuth (Bi) is substituted for some of the Yttrium (Y) on the dodecahedral site and Zirconium (Zr) is substituted for some of the Iron (Fe) on the octahedral site. Calcium ($Ca^{2+}$) is added to the dodecahedral site to replace some of the remaining Y to balance the Zr charges. Bi content can be varied to achieve varying material properties while Zr is held fixed at Zr=0.35.

In another implementation, the modified garnet composition may be represented by general Formula III: $Bi(Y,Ca)_2Fe_{4.2}M^I_{0.4}M^{II}_{0.4}O_{12}$, where $M^I$ is the octahedral substitution for Fe and can be selected from one or more of the following elements: In, Zn, Mg, Zr, Sn, Ta, Nb, Fe, Ti, and Sb, where $M^{II}$ is the tetrahedral substitution for Fe and can be selected from one or more of the following elements: Ga, W, Mo, Ge, V, Si.

Figure 3:
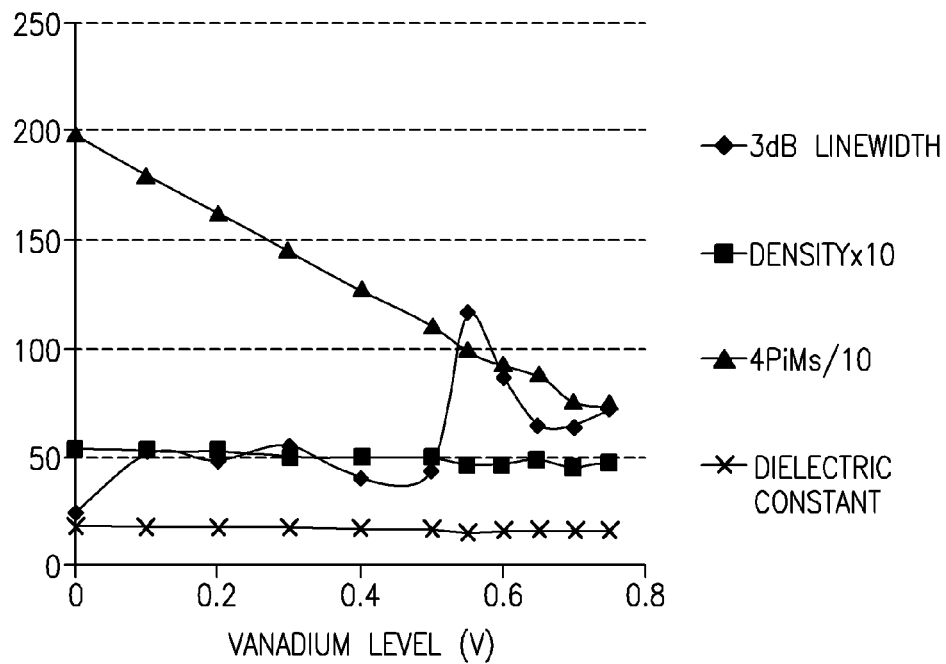
FIG. 3 is an example graph depicting variations of material properties versus varying levels of Vanadium in crystalline compositions represented by the formula $Y_{2.15-2x}Bi_{0.5}Ca_{0.35+2x}Zr_{0.35}V_xFe_{4.65-x}O_{12}$, where x=0.1 to 0.8.

In another implementation, the modified synthetic garnet composition may be represented by general Formula IV: $Y_{2.15-2x}Bi_{0.5}Ca_{0.35+2x}Zr_{0.35}V_xFe_{4.65-x}O_{12}$, wherein x=0.1 to 0.8. In this implementation, 0.1 to 0.8 formula units of Vanadium (V) is added to the tetrahedral site to substitute for some of the Iron (Fe), and Calcium (Ca) is added to balance the V charges and replace some of the remaining Y while the levels of Bi and Zr remain fixed similar to Formula III. FIG. 3 illustrates variations of material properties in connection with varying levels of V. As shown in FIG. 3, the dielectric constant and density of the material remain largely constant with varying levels of V. Increasing levels of V reduces the 4PiMs by about 160 Gauss for each 0.1 of V. As further shown in FIG. 3, there are no appreciable changes in 3 dB linewidth up to V=0.5.

Figure 4:
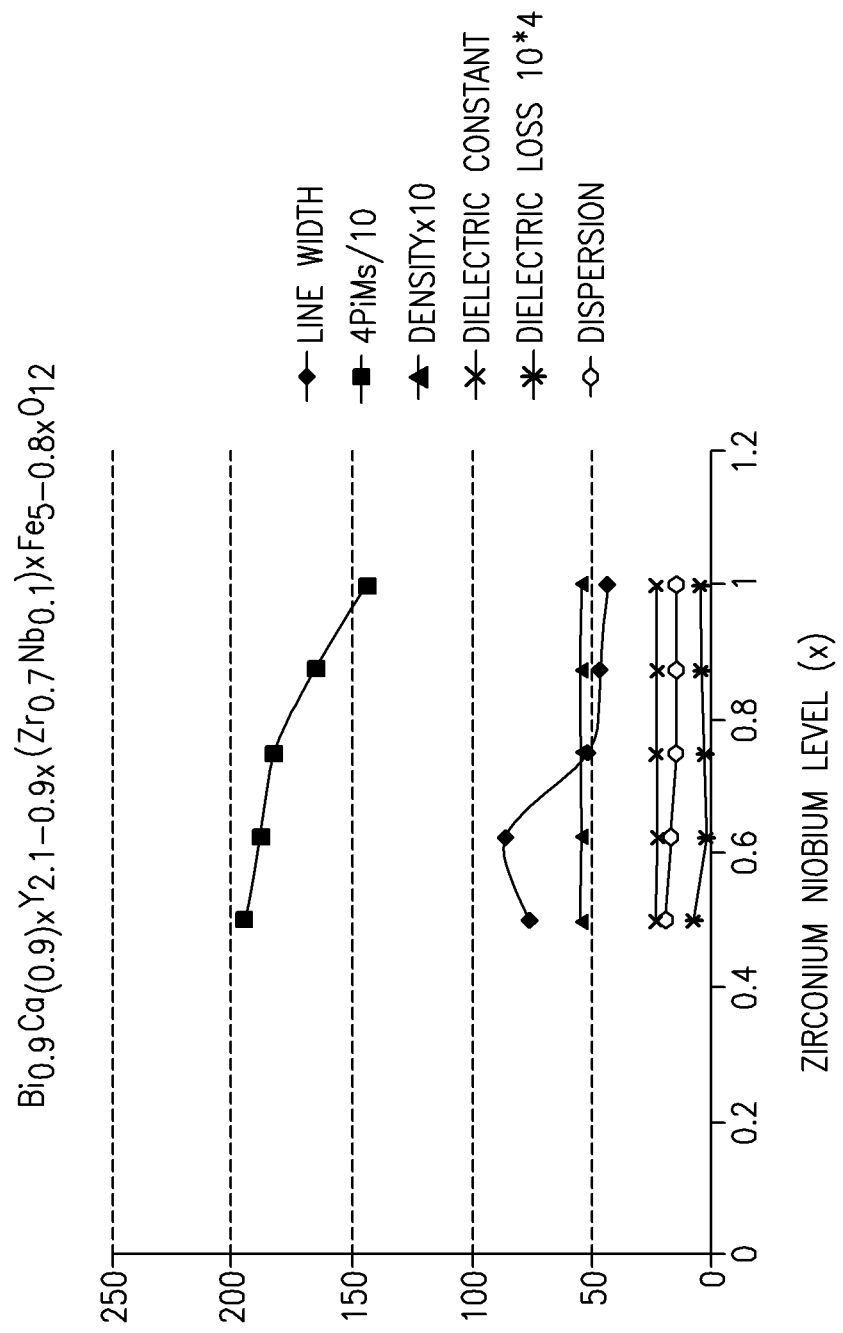
FIG. 4 is an example graph depicting variations of material properties versus varying levels of (Zr, Nb) in crystalline compositions represented by the formula $Bi_{0.9}Ca_{0.9x}Y_{2.1-0.9x}(Zr_{0.7}Nb_{0.1})_xFe_{5-0.8x}O_{12}$, where x=0.5 to 1.0.
Figure 5A:
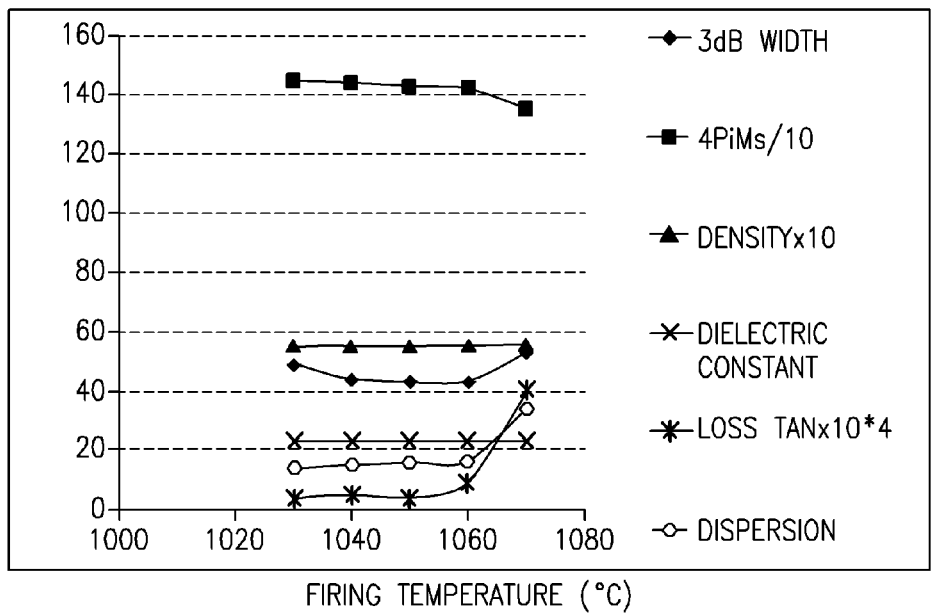
FIGS. 5A-5G are example graphs depicting the relationship between firing temperature and various properties at varying levels of Vanadium in crystalline compositions represented by the formula $Bi_{0.9}Ca_{0.9+2x}Zr_{0.7}Nb_{0.1}V_xFe_{4.2-x}O_{12}$ where x=0-0.6.
Figure 5B:
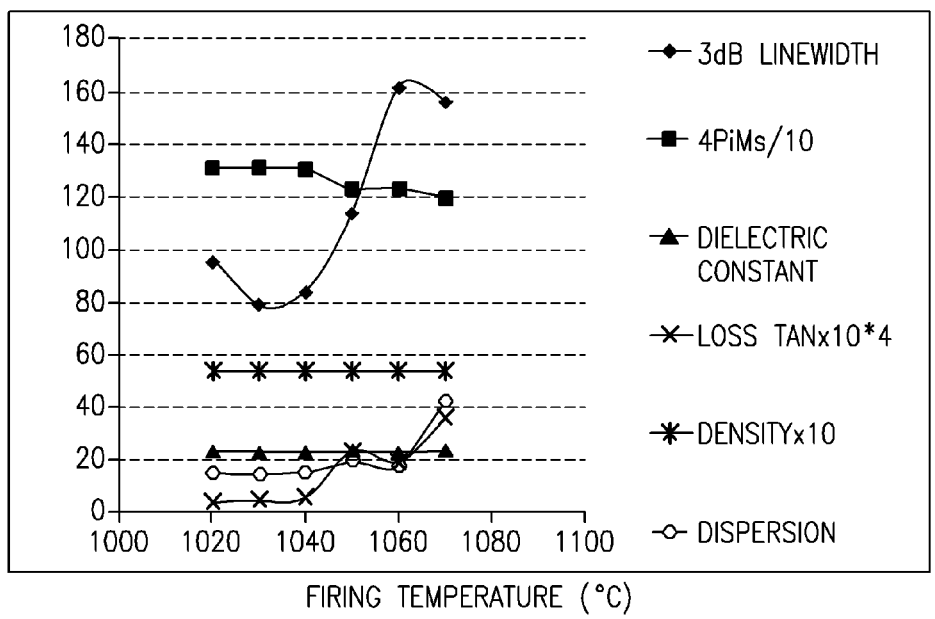
Figure 5C:
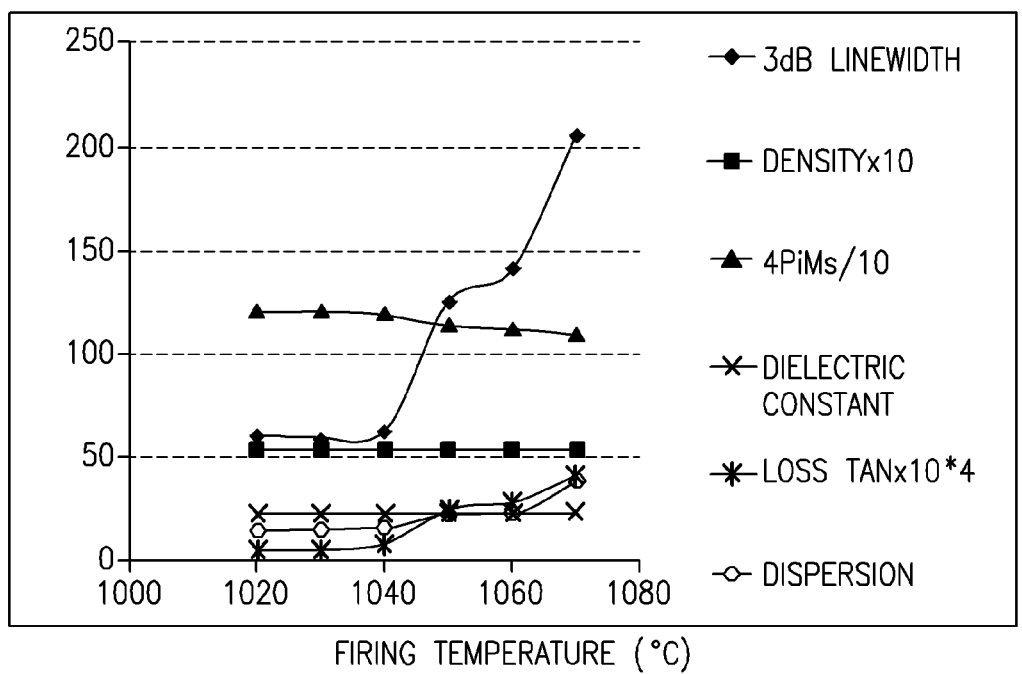
Figure 5D:
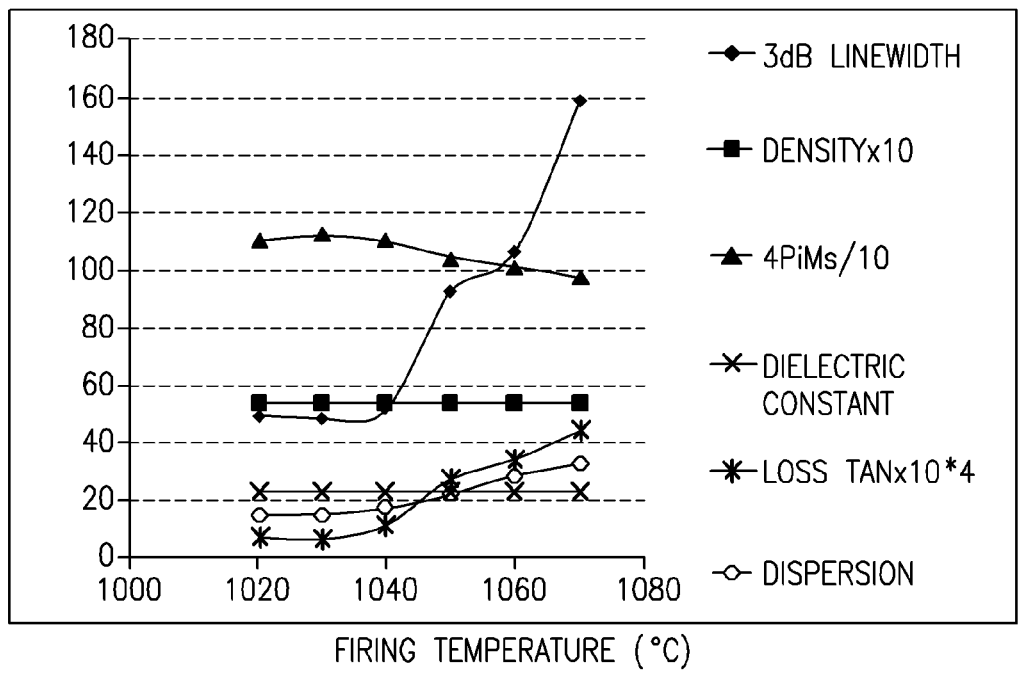
Figure 5E:
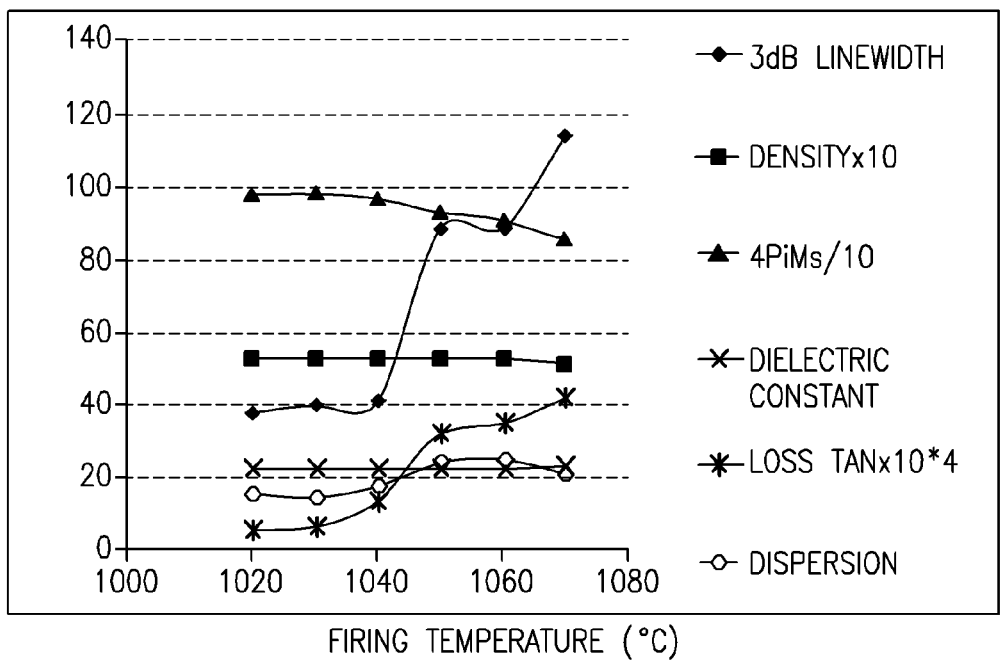
Figure 5F:
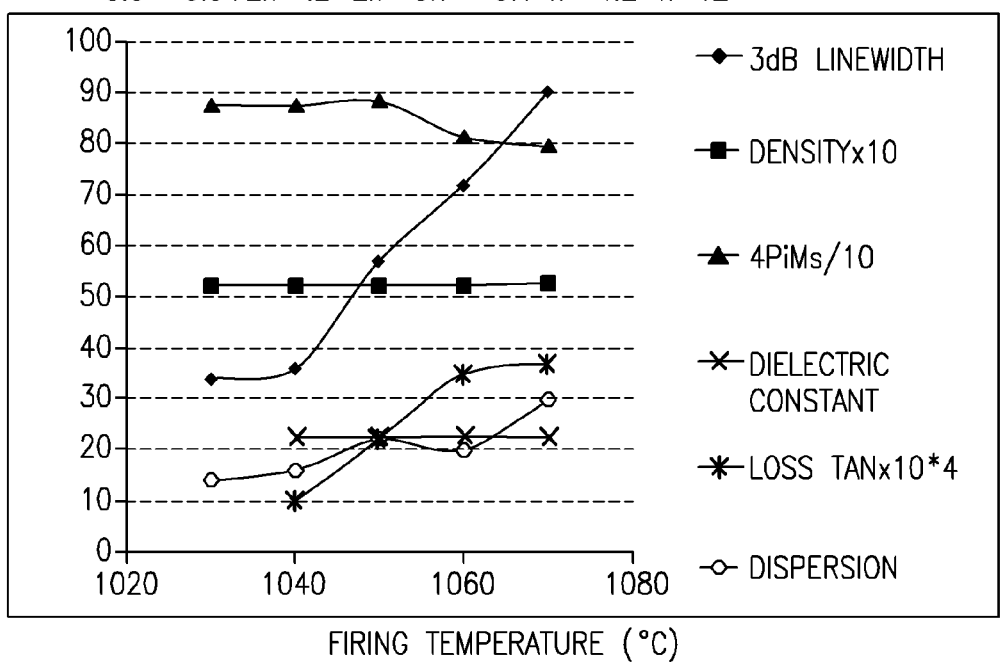
Figure 5G:
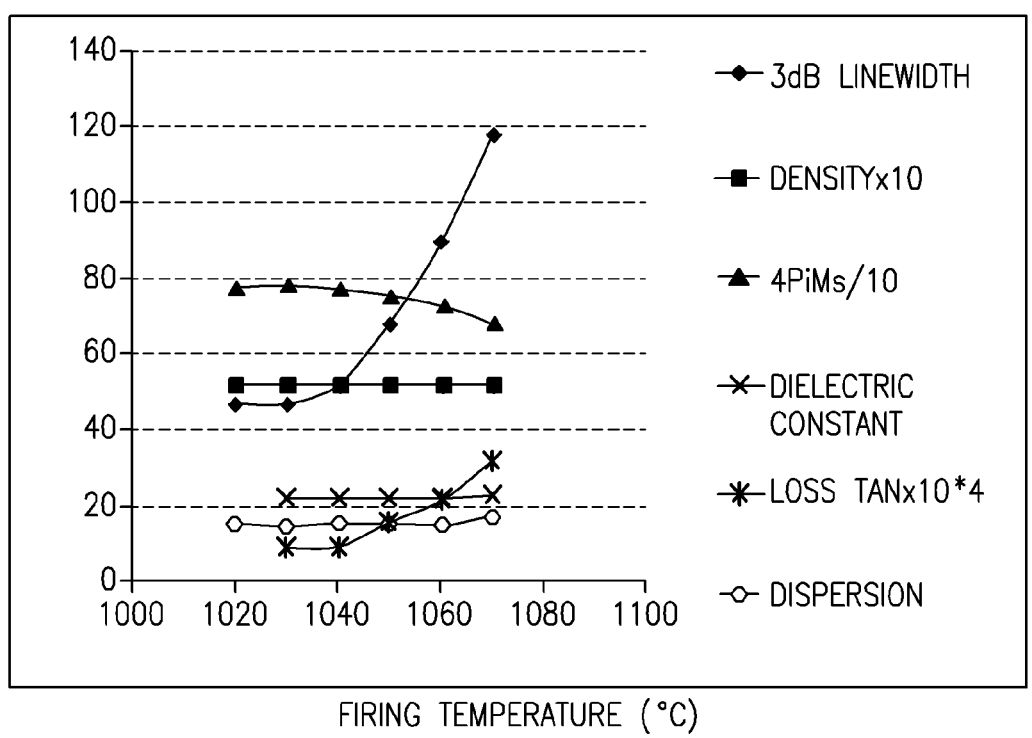

In another implementation, the modified synthetic garnet composition may be represented by Formula V: $Bi_{0.9}Ca_{0.9x}Y_{2.1-0.9x}(Zr_{0.7}Nb_{0.1})_xFe_{5-0.8x}O_{12}$, wherein x=0.5 to 1.0. In this implementation, the octahedral substitution is made with two high valency ions: $Zr^{4+}$ and $Nb^{5+}$ with Bi held constant at 0.9. FIG. 4 illustrates variations of material properties in connection with varying levels of (Zr, Nb). As shown in FIG. 4, the magnetic resonance linewidth decreased with higher octahedral substitutions. The magnetization also fell as the increase in total non-magnetic ions overcomes the higher non-magnetic octahedral substitutions.

Figure 6:
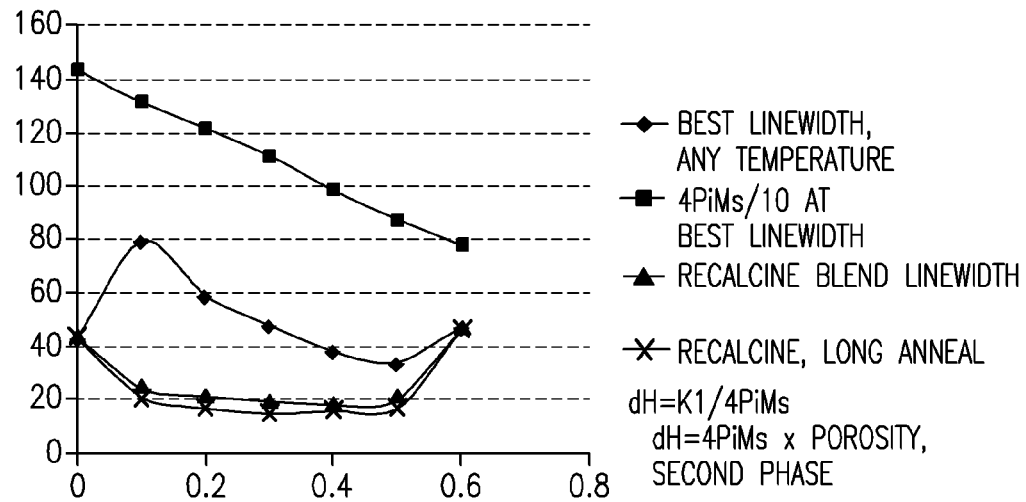
FIG. 6 is an example graph depicting best linewidth versus composition of varying Vanadium content in crystalline compositions represented by the formula $Bi_{0.9}Ca_{0.9+2x}Zr_{0.7}Nb_{0.1}V_xFe_{4.2-x}O_{12}$ where x=0-0.6.

In another implementation, the modified synthetic garnet composition may be represented by Formula VI: $Bi_{0.9}Ca_{0.9+2x}Y_{2.1-0.9-2x}Zr_{0.7}Nb_{0.1}V_xFe_{4.2-x}O_{12}$, where V=0-0.6. In this implementation, Vanadium is introduced to the octahedral site in addition to Zr and Nb. When V=0.6, Y is completely replaced. FIGS. 5A-5G illustrate the relationship between firing temperatures and various material properties as V level increases from 0 to 0.6. As illustrated, the 3 dB linewidth, measured in accordance with ASTM A883/A883M-01, tends to remain below 50 Oe at all V levels at firing temperatures below 1040° C. FIG. 6 illustrates the best linewidth at varying firing temperatures versus composition at varying levels of V of one preferred embodiment. In some implementations, the linewidth can be further reduced by annealing the material. The effect of annealing on linewidth of $Bi_{0.9}Ca\_Zr_{0.7}Nb_{0.1}V_xFe_{4.2-x}O_{12}$, where x=0.1 to 0.5 is illustrated in Table 1 below.

TABLE 1

Linewidth (Oe) and Curie Temp. (° C.) Data for $Bi_{0.9}Ca_{0.9+2x}Y_{2.1-0.9-2x}(Zr, Nb)_{0.8}V_xFe_{4.2-x}O_{12}$

| Formula | Heat Treatment (Initial Blend) | 3 dB before anneal | 3 dB after anneal | Heat Treatment (Calcined Blend) | 3 dB before anneal | 3 dB after anneal | Heat Treatment (Calcined Blend + Extended Milling) | 3 dB before anneal | 3 dB after extended anneal | Curie Temp |
|---|---|---|---|---|---|---|---|---|---|---|
| V = 0.5 | 1050 | 39 | 25 | 1030 | 38 | 20 | 1030 | 38 | 17 | 108 |
| V = 0.4 | 1050 | 44 | 27 | 1030 | 48 | 18 | 1030 | 42 | 16 | 112 |
| V = 0.3 | 1050 | 52 | 32 | 1030 | 46 | 19 | 1030 | 48 | 15 | 111 |
| V = 0.2 | 1050 | 59 | 43 | 1030 | 55 | 21 | 1030 | 62 | 17 | 108 |
| V = 0.1 | 1050 | 78 | 62 | 1030 | 61 | 24 | 1030 | 55 | 21 | 107 |

Figure 7:
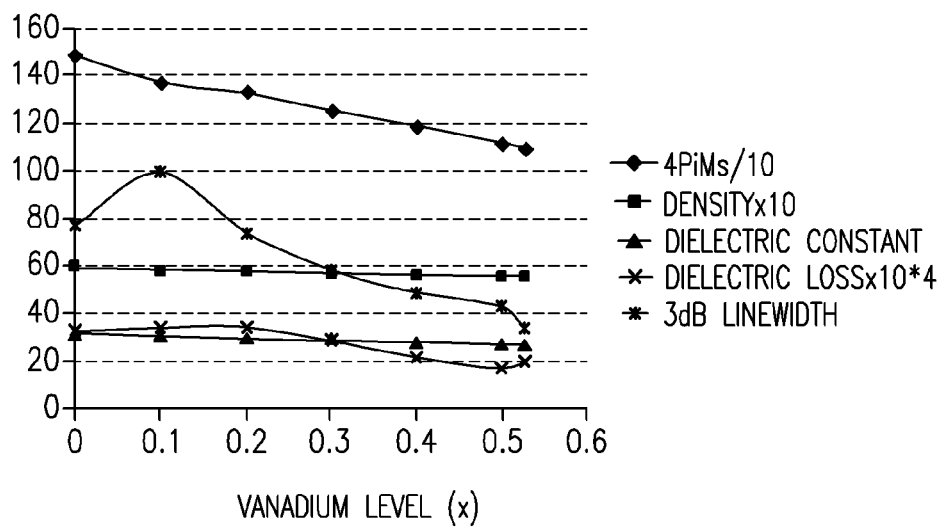
FIG. 7 is an example graph illustrating the properties of crystal compositions represented by the formula $Bi_{1.4}Ca_{1.05-2x}Zr_{0.55}V_xFe_{4.45-x}O_{12}$, where x=0-0.525.

In another implementation, the modified synthetic garnet composition may be represented by Formula VI: $Bi_{1.4}Ca_{1.05-2x}Zr_{0.55}V_xFe_{4.45-x}O_{12}$, where x=0-0.525. In this implementation, the level of Bi doping is increased while the level of octahedral substitution is decreased. The material formed has higher Curie temperature and low linewidth. The Vanadium (V) content is varied from 0 to 0.525. When V=0.525, the composition is free of Yttrium. The resulting material achieved a linewidth of 20 Oe without subsequently heat treatment. FIG. 7 illustrates the properties of the material with varying amount of V. As shown in FIG. 7, V drops the dielectric constant rapidly, about 1 unit for each 0.1 of V in the formula unit, and drops the magnetization by about 80 Gauss for each 0.1 of V. Optimizing the processing parameters such as firing conditions have produced linewidth as low as 11 or V at or close to 0.525, which is free of Y. These values are comparable to commercially available Calcium Yttrium Zirconium Vanadium garnets of the same magnetization.

In another implementation, the modified synthetic garnet composition may be represented by Formula VII: $Y_2CaFe_{4.4}Zr_{0.4}Mo_{0.2}O_{12}$. In this implementation, high valency ion Molybdenum (Mo) is added to the tetrahedral site to create a single phase crystal. In other implementations, the modified synthetic garnet compositions can be represented by a formula selected from the group consisting of: $BiY_2Fe_{4.6}In_{0.4}O_{12}$, $BiCa_{0.4}Y_{1.6}Fe_{4.6}Zr_{0.4}O_{12}$, $BiCa_{0.4}Y_{1.6}Fe_{4.6}Ti_{0.4}O_{12}$, $BiCa_{0.8}Y_{1.2}Fe_{4.6}Sb_{0.4}O_{12}$, $BiY_2Fe_{4.6}Ga_{0.4}O_{12}$, $BiCa_{1.2}Y_{0.8}Fe_{4.2}In_{0.4}Mo_{0.4}O_{12}$, $BiY_{1.2}Ca_{0.8}Fe_{4.2}Zn_{0.4}Mo_{0.4}O_{12}$, $BiY_{1.2}Ca_{0.8}Fe_{4.2}Mg_{0.4}Mo_{0.4}O_{12}$, $BiY_{0.4}Ca_{1.6}Fe_{4.2}Zr_{0.4}Mo_{0.4}O_{12}$, $BiY_{0.4}Ca_{1.6}Fe_{4.2}Sn_{0.4}Mo_{0.4}O_{12}$, $BiCa_2Fe_{4.2}Ta_{0.4}Mo_{0.4}O_{12}$, $BiCa_2Fe_{4.2}Nb_{0.4}Mo_{0.4}O_{12}$, $BiY_{0.8}Ca_{1.2}Fe_{4.6}Mo_{0.4}O_{12}$, and $BiY_{0.4}Ca_{1.6}Fe_{4.2}Ti_{0.4}Mo_{0.4}O_{12}$.

Preparation of the Modified Synthetic Garnet Compositions:

The preparation of the modified synthetic garnet materials can be accomplished by using known ceramic techniques. A particular example of the process flow is illustrated in FIG. 8.

Figure 8:
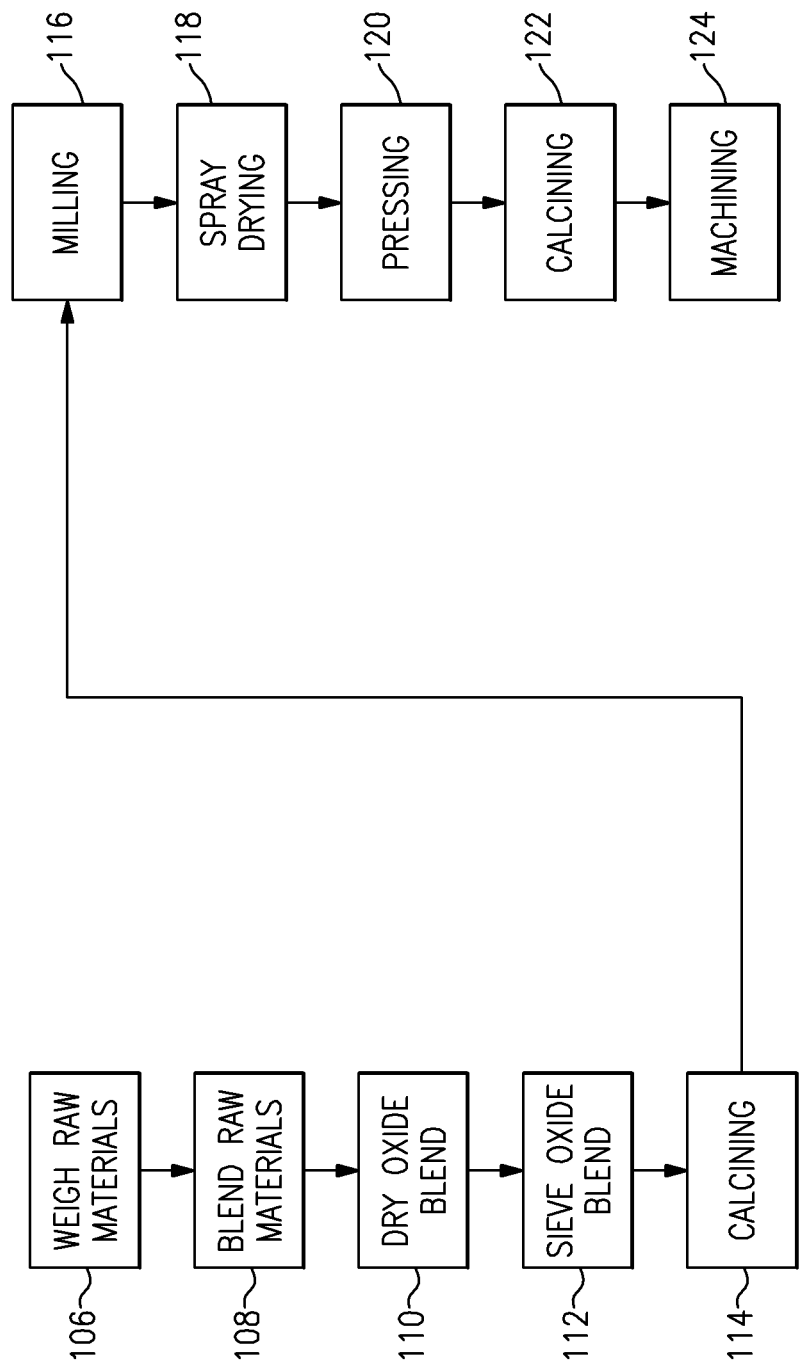
FIG. 8 illustrates an example process flow for making a modified synthetic garnet having one or more features described herein.

As shown in FIG. 8, the process begins with step 106 for weighing the raw material. The raw material may include oxides and carbonates such as Iron Oxide ($Fe_2O_3$), Bismuth Oxide ($Bi_2O_3$), Yttrium Oxide ($Y_2O_3$), Calcium Carbonate ($CaCO_3$), Zirconium Oxide ($ZrO_2$), Vanadium Pentoxide ($V_2O_5$), Yttrium Vanadate ($YVO_4$), Bismuth Niobate ($BiNbO_4$), Silica ($SiO_2$), Niobium Pentoxide ($Nb_2O_5$), Antimony Oxide ($Sb_2O_3$), Molybdenum Oxide ($MoO_3$), Indium Oxide ($In_2O_3$), or combinations thereof. In one embodiment, raw material consisting essentially of about 35-40 wt % Bismuth Oxide, more preferably about 38.61 wt %; about 10-12 wt % Calcium Oxide, more preferably about 10.62 wt %; about 35-40 wt % Iron Oxide, more preferably about 37 wt %, about 5-10 wt % Zirconium Oxide, more preferably about 8.02 wt %; about 4-6 wt % Vanadium Oxide, more preferably about 5.65 wt %. In addition, organic based materials may be used in a sol gel process for ethoxides and/or acrylates or citrate based techniques may be employed. Other known methods in the art such as co-precipitation of hydroxides may also be employed as a method to obtain the materials. The amount and selection of raw material depend on the specific formulation.

After the raw material is weighed, they are blended in Step 108 using methods consistent with the current state of the ceramic art, which can include aqueous blending using a mixing propeller, or aqueous blending using a vibratory mill with steel or zirconia media. In some embodiments, a glycine nitrate or spray pyrolysis technique may be used for blending and simultaneously reacting the raw materials.

The blended oxide is subsequently dried in Step 110, which can be accomplished by pouring the slurry into a pane and drying in an oven, preferably between 100-400° C. or by spray drying, or by other techniques known in the art.

The dried oxide blend is processed through a sieve in Step 112, which homogenizes the powder and breaks up soft agglomerates that may lead to dense particles after calcining.

The material is subsequently processed through a pre-sintering calcining in Step 114. Preferably, the material is loaded into a container such as an alumina or cordierite sagger and heat treated in the range of about 800-1000° C., more preferably about 900-950° C. Preferably, the firing temperature is low as higher firing temperatures have an adverse effect on linewidth.

After calcining, the material is milled in Step 116, preferably in a vibratory mill, an attrition mill, a jet mill or other standard comminution technique to reduce the median particle size into the range of about 0.5 micron to 10 microns. Milling is preferably done in a water based slurry but may also be done in ethyl alcohol or another organic based solvent.

The material is subsequently spray dried in Step 118. During the spray drying process, organic additives such as binders and plasticizers can be added to the slurry using techniques known in the art. The material is spray dried to provide granules amenable to pressing, preferably in the range of about 10 microns to 150 microns in size.

The spray dried granules are subsequently pressed in Step 120, preferably by uniaxial or isostatic pressing to achieve a pressed density to as close to 60% of the x-ray theoretical density as possible. In addition, other known methods such as tape casting, tape calendaring or extrusion may be employed as well to form the unfired body.

The pressed material is subsequently processed through a calcining process in Step 122. Preferably, the pressed material is placed on a setter plate made of material such as alumina which does not readily react with the garnet material. The setter plate is heated in a periodic kiln or a tunnel kiln in air or pressure oxygen in the range of between about 850° C.-100° C. to obtain a dense ceramic compact. Other known treatment techniques such as induction heat may also be used in this step.

The dense ceramic compact is machined in the Step 124 to achieve dimensions suitable or the particular applications.

Radio-frequency (RF) applications that utilize synthetic garnet compositions can include ferrite devices having relatively low magnetic resonance linewidths (e.g., approximately 11 Oe or less) as described in reference to FIGS. 2-8. RF applications can also include devices, methods, and/or systems having or related to garnet compositions having reduced or substantially nil reduced earth content. As described herein, such garnet compositions can be configured to yield relatively high dielectric constants; and such a feature can be utilized to provide advantageous functionalities. It will be understood that at least some of the compositions, devices, and methods described in reference to FIGS. 2-8 can be applied to such implementations.

Figure 9:
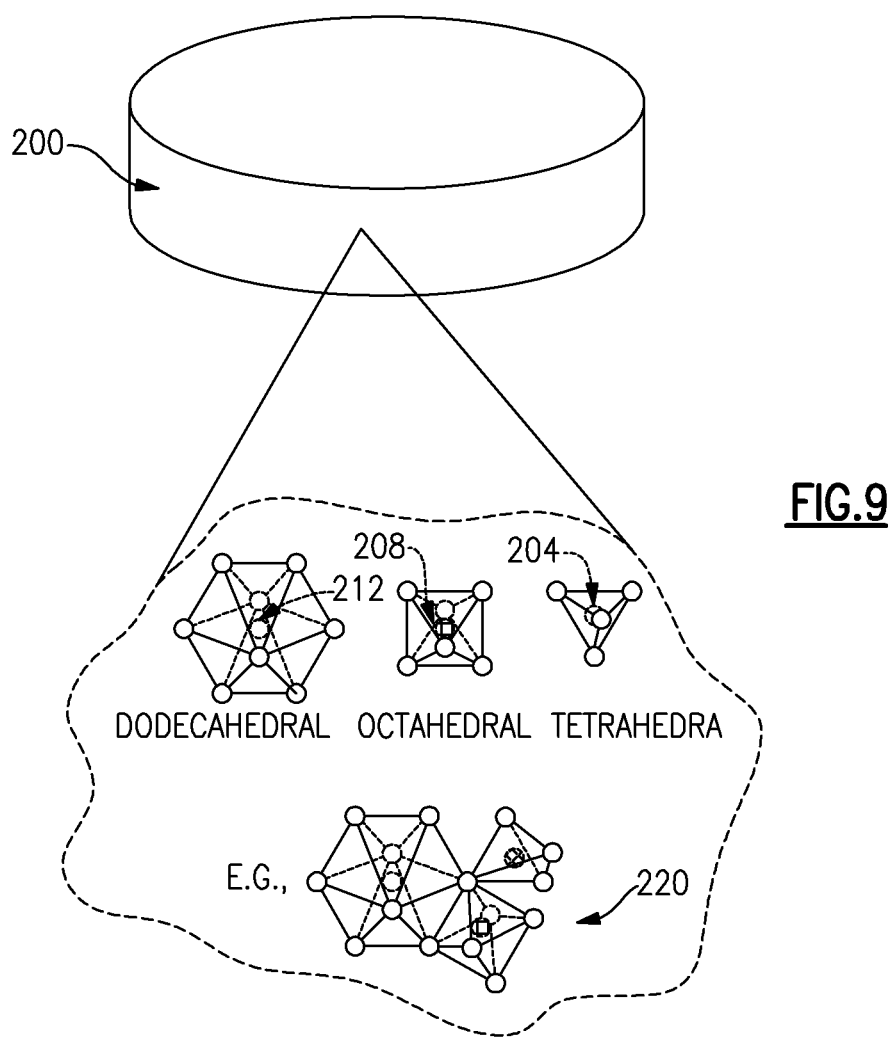
FIG. 9 shows an example ferrite device having one or more garnet features as described herein.

FIG. 9 shows a radio-frequency (RF) device 200 having garnet structure and chemistry, and thus a plurality of dodecahedral structures, octahedral structures, and tetrahedral structures. The device 200 can include garnet structures (e.g., a garnet structure 220) formed from such dodecahedral, octahedral, and tetrahedral structures. Disclosed herein are various examples of how dodecahedral sites 212, octahedral sites 208, and tetrahedral sites 204 can be filled by or substituted with different ions to yield one or more desirable properties for the RF device 200. Such properties can include, but are not limited to desirable RF properties and cost-effectiveness of manufacturing of ceramic materials that can be utilized to fabricate the RF device 200. By way of an example, disclosed herein are ceramic materials having relatively high dielectric constants, and having reduced or substantially nil rare earth contents.

Some design considerations for achieving such features are now described. Also described are example devices and related RF performance comparisons. Also described are example applications of such devices, as well as fabrication examples.

Rare Earth Garnets:

Garnet systems in commercial use typically belong to a series of compositions that can be expressed as $Y_{3-x}$(RE or Ca)$_x$Fe$_{2-y}$(Me)$_y$Fe$_{3-z}$(Me')$_z$O$_{12}$, where "RE" represents a non-Y rare earth element. The non-Y rare earth element (RE) can be, for example, Gd for temperature compensation of magnetization, with small amounts of Ho sometimes used for high power doping purposes. Rare earths are typically trivalent and occupy dodecahedral sites. "Me" in octahedral sites is typically non-magnetic (e.g., typically Zr$^{+4}$, although In$^{+3}$ or Sn$^{+4}$ can been used, typically at around y=0.4 in the formula). "Me'" in tetrahedral sites is typically non-magnetic (e.g., typically Al$^{+3}$ or V$^{+5}$, where z can vary from 0 to around 1 in the formula to give a range of magnetizations). Ca$^{+2}$ is typically used in dodecahedral sites for valency compensation when the octahedral or tetrahedral substitution is an ion of valency>3. Based on the foregoing, one can see that such commercial garnet systems contain greater than 40% Y or other RE elements, with the balance mainly Fe$^{+3}$ on octahedral and tetrahedral sites.

Ferrite Device Design Considerations:

Magnetization (4πM$_s$) of ferrite devices for RF applications such as cellular infrastructure typically operate at 400 MHz to 3 GHz in an above-resonance mode. To achieve typical bandwidths of about 5 to 15%, magnetizations in a range of approximately 1,000 to 2,000 Gauss (approximately 0.1 to 0.2 Tesla) are desired.

Magnetic losses associated with ferrite devices can be determined by a ferrimagnetic resonance linewidth ΔH$_o$. Values for such linewidth are typically less than about 30 Oersted (about 0.377 Ampere-turns/meter), and are typically equivalent to K$_1$/M$_s$, where K$_1$ is a first order magnetocrystalline anisotropy, determined by the anisotropy of the Fe$^{+3}$ ion in two of its sites if non-magnetic Y is the only RE. There can also be a fractional porosity (p) contribution to linewidth, approximately 4πM$_s$×p.

Dielectric losses associated with ferrite devices are typically selected so that loss tangent δ satisfies a condition tan δ<0.0004. The Curie temperature associated with ferrite devices can be expected to exceed approximately 160° C. for the above range of magnetizations.

Bismuth Garnets:

Single crystal materials with a formula Bi$_{(3-2x)}$Ca$_{2x}$Fe$_{5-x}$V$_x$O$_{12}$ have been grown in the past, where x was 1.25. A 4πM$_s$ value of about 600 Gauss was obtained (which is suitable for some tunable filters and resonators in a 1-2 GHz range), with linewidths of about 1 Oersted, indicating low intrinsic magnetic losses for the system. However, the level of Bi substitution was only about 0.5 in the formula.

Attempts to make single phase polycrystalline materials (with a formula Bi$_{3-2x}$Ca$_{2x}$V$_x$Fe$_{5-x}$O$_{12}$) similar to the single crystal materials were successful only in a region of x>0.96, effectively confining the 4πM$_s$ to less than about 700 Oersted and resulting in poor linewidths (greater than 100 Oersted). Small amounts of Al$^{+3}$ reduced the linewidth to about 75 Oersted, but increased Al$^{+3}$ reduced 4πM$_s$. Bi substitution was only about 0.4 in the formula for these materials.

For Faraday rotation devices, the Faraday rotation can be essentially proportionate to the level of Bi substitution in garnets, raising interest in increasing the level of substitution. Anisotropy is generally not a major factor for optical applications, so substitution on the octahedral and tetrahedral site can be based on maximizing the rotation. Thus, in such applications, it may be desirable to introduce as much Bi$^{+3}$ into the dodecahedral site as possible. The maximum level of Bi$^{+3}$ can be influenced by the size of the dodecahedral rare earth trivalent ion, and can vary between 1.2 and 1.8 in the formula.

In some situations, the level of Bi$^{+3}$ substitution can be affected by substitutions on the other sites. Because Bi$^{+3}$ is non-magnetic, it can influence the Faraday rotation through its effect on the tetrahedral and octahedral Fe$^{+3}$ ions. Since this is thought to be a spin-orbital interaction, where Bi$^{+3}$ modifies existing Fe$^{+3}$ pair transitions, one can expect both a change in the anisotropy of the Fe$^{+3}$ ions and optical effects including large Faraday rotation. The Curie temperature of Bi$^{+3}$ substituted YIG can also increase at low Bi$^{+3}$ substitution.

Bi Substitution in Polycrystalline Garnets:

To see the effects (e.g., low magnetocrystalline anisotropy and hence low magnetic losses) that can result from combinations of Bi$^{+3}$ on the dodecahedral site and Zr$^{+4}$ on the octahedral site, following approaches were tested. The first example configuration included fixed Bi and variable Zr in a formula Bi$_{0.5}$Y$_{2.5-x}$Ca$_x$Zr$_x$Fe$_{5-x}$O$_{12}$, where x varied from approximately 0 to 0.35. The second example configuration included fixed Zr and variable Bi in a formula Bi$_x$Y$_{2.65-x}$Ca$_{0.35}$Zr$_{0.35}$Fe$_{4.65}$O$_{12}$, where x varied from approximately 0.5 to 1.4.

Figure 10:
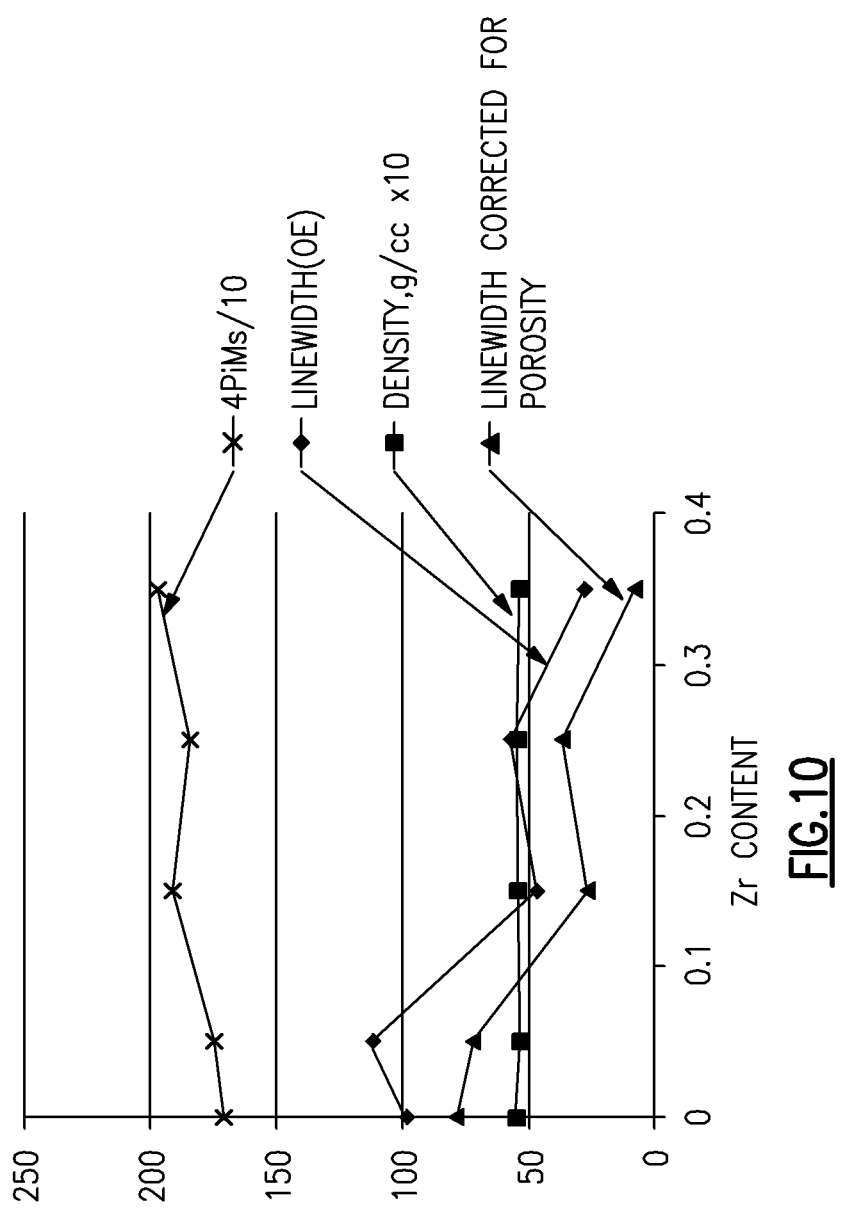
FIG. 10 shows various properties as functions of Zr content for an example composition $Bi_{0.5}Y_{2.5-x}Ca_xZr_xFe_{5-x}O_{12}$ where $Bi^{+3}$ content is substantially fixed at approximately 0.5 while $Zr^{+4}$ content is varied from 0 to 0.35.

FIG. 10 shows various properties as functions of Zr content for the first configuration (Bi$_{0.5}$Y$_{2.5-x}$Ca$_x$Zr$_x$Fe$_{5-x}$O$_{12}$) where Bi$^{+3}$ content was fixed at approximately 0.5 while Zr$^{+4}$ content was varied from 0 to 0.35. From the plots, one can see that the 0.5 Bi material at zero Zr has a relatively high linewidth (near 80 Oe after porosity correction). This is in contrast to standard Y$_3$Fe$_5$O$_{12}$, which has a much lower corrected value of about 17 Oe, indicating that non-magnetic Bi$^{+3}$ can substantially raise the magnetocrystalline anisotropy, K$_1$ contribution from the octahedral and tetrahedral Fe$^{+3}$.

One can also see, as found in Bi-free garnet, that the introduction of increasing amounts of Zr$^{+4}$ progressively lowers the anisotropy contribution, and very low linewidths are found at Zr=0.35, albeit with some reduction in Curie temperature. The expected result is a higher Curie temperature from the Bi content being offset by the Zr contribution.

As further shown in FIG. 10, although the 4πM$_s$ value generally increases with Zr content, the effect on the K$_1$/M$_s$ contribution is overwhelmingly on K$_1$, representing a significant technical breakthrough.

Figure 11:
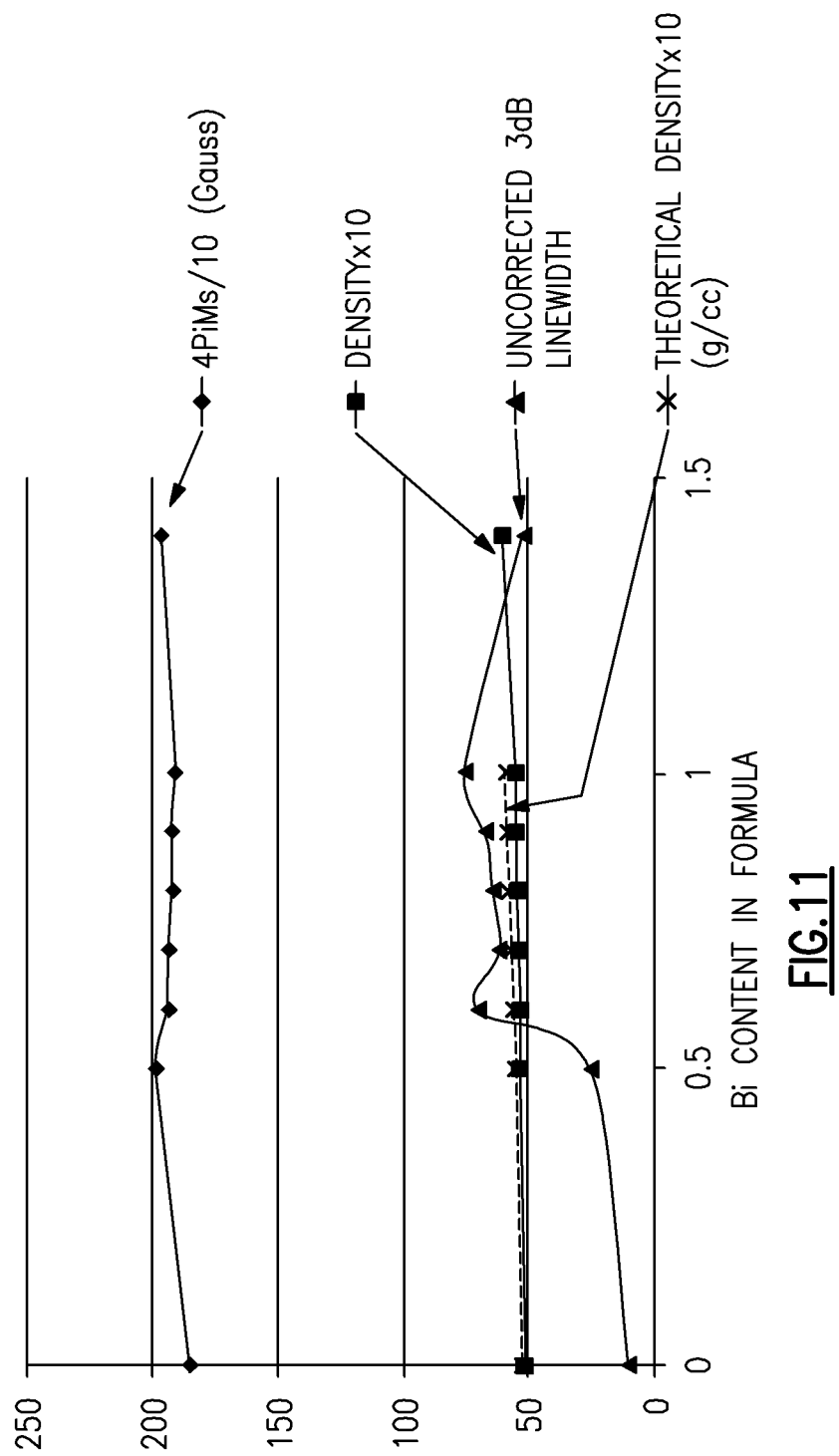
FIG. 11 shows various properties as functions of Bi content for an example composition $Bi_xY_{2.65-x}Ca_{0.35}Zr_{0.35}Fe_{4.65}O_{12}$ where $Zr^{+4}$ content is substantially fixed at approximately 0.35 while $Bi^{+3}$ content is varied.
Figure 12:
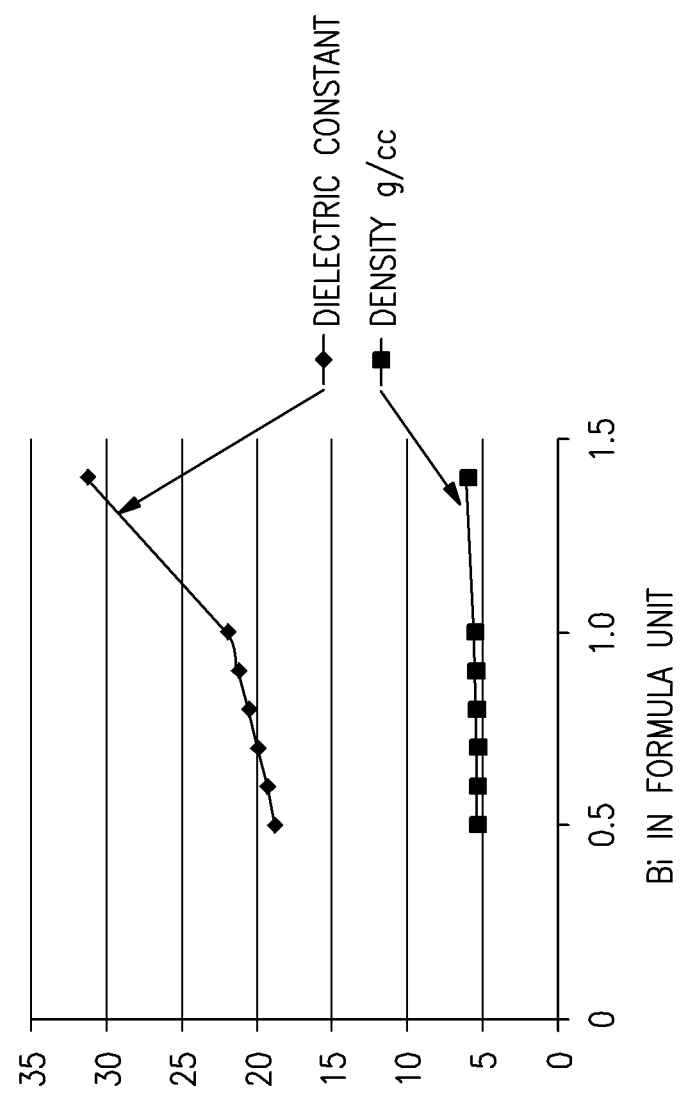
FIG. 12 shows dielectric constant and density as functions of Bi content for the example composition of FIG. 11.

FIG. 11 shows various properties as functions of Bi content for the second configuration (Bi$_x$Y$_{2.65-x}$Ca$_{0.35}$Zr$_{0.35}$Fe$_{4.65}$O$_{12}$) where Zr$^{+4}$ content was fixed at approximately 0.35 while Bi$^{+3}$ content was varied. FIG. 12 shows dielectric constant and density as functions of Bi content for the same configuration. One can see that a large increase in dielectric constant occurs when Bi content is greater than approximately 1. In some implementations, such an increased dielectric constant can be utilized to yield RF devices having desirable features.

It appeared that the maximum Bi$^{+3}$ content was 1.4 in the formula, and therefore can be a optimum or desired amount to replace Y$^{+3}$, at least in the range of Zr$^{+4}$ substitution examined. At the example desired Bi content of 1.4, there was a desire to optimize the Zr$^{+4}$ content to reduce or minimize the linewidth without substantially reducing the Curie temperature. Also considered was a possibility of implementing a range of V$^{+5}$ substitutions which can yield a range of magnetizations without much reduction in Curie temperature (e.g., as found in Y-based Zr or In Ca—V garnets).

Based at least in part on the foregoing, the following substitutions were tested to optimize or improve Bi-substituted garnet compositions. For example, by using Ca$^{+2}$ to balance V$^{+5}$, more Y could be displaced, at a rate of 2 Ca$^{+2}$ for 1 $V^{+5}$. In another example, $Zr^{+4}$ can yield 1:1 substitution of $Ca^{+2}$ for Y; thus, if $Nb^{+5}$ could be used instead on the octahedral site, more Y could be removed from the compositions.

Figure 13:
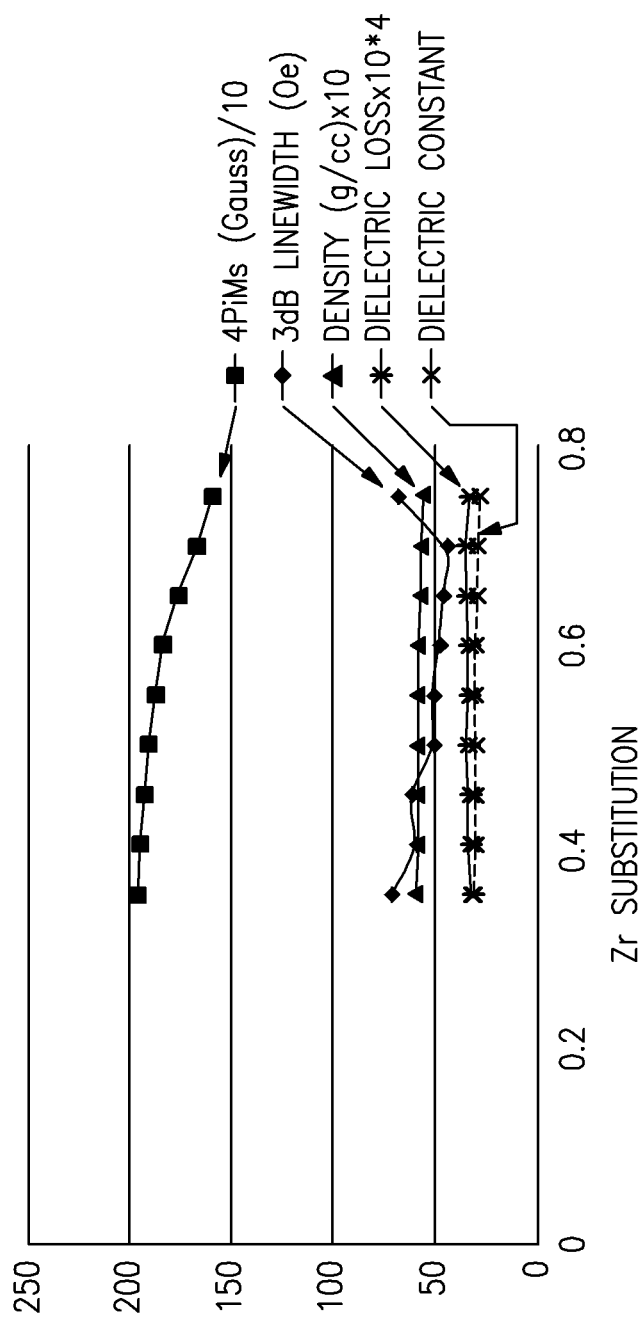
FIG. 13 shows plots of various properties as functions of Zr content that extends beyond the 0.35 limit of the example composition of FIG. 10.

FIG. 13 shows plots of various properties as functions of Zr content that extends beyond the 0.35 limit described in reference to FIG. 10. Such measurements were based on the foregoing selection of Bi content (approximately 1.4) to refine or optimize the Zr content. Based on such measurements, an example Zr content of 0.55 was selected to test effects of variation of $V^{+5}$ content.

Figure 14:
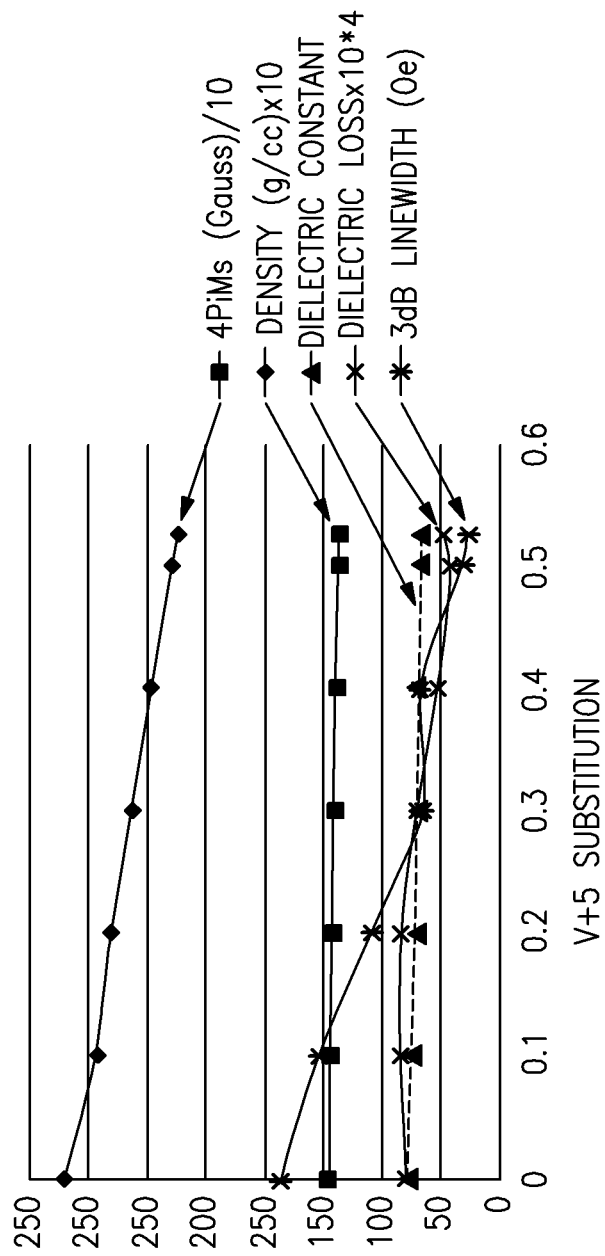
FIG. 14 shows plots of various properties as functions of $V^{+5}$ content when Bi content is approximately 1.4 and Zr content is approximately 0.55 for the example composition of FIG. 13.

FIG. 14 shows plots of various properties as functions of v+5 content. For such measurements, Bi content was held as approximately 1.4, and Zr content was held at approximately 0.55. It is noted that at the maximum $V^{+5}$ substitution, the example composition ($Bi_{1.4}Ca_{1.6}Zr_{0.55}V_{0.525}Fe_{3.925}O_{12}$) is substantially free of rare earth.

In the context of RF applications, following observations can be made for the foregoing example rare earth-free composition ($Bi_{1.4}Ca_{1.6}Zr_{0.55}V_{0.525}Fe_{3.925}O_{12}$). Dielectric constant is approximately 27; and this is thought to be due to the "lone pair" of electrons on $Bi^{+3}$ which can greatly increase the polarizability of the ion. Dielectric loss is less than 0.0004, which is useful for most applications. Magnetic loss (as linewidth) is approximately 11 Oersted, which is comparable with the best Y based garnets. $4\pi M_s$ is approximately 1150 Gauss, which is useful for many RF devices such as those used in cellular infrastructures. Curie temperature is approximately 160° C., which is useful for most applications.

Examples of Devices Having Rare Earth Free or Reduced Garnets:

As described herein, garnets having reduced or no rare earth content can be formed, and such garnets can have desirable properties for use in devices for applications such as RF applications. In some implementations, such devices can be configured to take advantage of unique properties of the $Bi^{+3}$ ion.

For example, the "lone pair" of electrons on the $Bi^{+3}$ ion can raise the ionic polarizability and hence the dielectric constant. This is consistent with the measurement observed in reference to FIG. 14. In that example, the dielectric constant roughly doubled, from 15 to 27 as one went from standard YCaZrV garnets to BiCaZrV garnets when Bi was at maximum substitution at 1.4 in the formula. Such an increase in dielectric constant can be utilized in a number of ways.

For example, because the center frequency of a ferrite device (such as a garnet disk) operating in a split polarization transverse magnetic (TM) mode is proportional to $1/(\varepsilon)^{1/2}$, doubling the dielectric constant ($\varepsilon$) can reduce the frequency by a factor of square root of 2 (approximately 1.414). As described herein in greater detail, increasing the dielectric constant by, for example, a factor of 2, can result in a reduction in a lateral dimension (e.g., diameter) of a ferrite disk by factor of square root of 2. Accordingly, the ferrite disk's area can be reduced by a factor of 2. Such a reduction in size can be advantageous since the device's footprint area on an RF circuit board can be reduced (e.g., by a factor of 2 when the dielectric constant is increased by a factor of 2). Although described in the context of the example increase by a factor of 2, similar advantages can be realized in configurations involving factors that are more or less than 2.

Reduced Size Circulators/Isolators Having Ferrite with High Dielectric Constant:

As described herein, ferrite devices having garnets with reduced or no rare earth content can be configured to include a high dielectric constant property. Various design considerations concerning dielectric constants as applied to RF applications are now described. In some implementations, such designs utilizing garnets with high dielectric constants may or may not necessarily involve rare earth free configurations.

Values of dielectric constant for microwave ferrite garnets and spinels commonly fall in a range of 12 to 18 for dense polycrystalline ceramic materials. Such garnets are typically used for above ferromagnetic resonance applications in, for example, UHF and low microwave region, because of their low resonance linewidth. Such spinels are typically used at, for example, medium to high microwave frequencies, for below resonance applications, because of their higher magnetization. Most, if not substantially all, circulators or isolators that use such ferrite devices are designed with triplate/stripline or waveguide structures.

Dielectric constant values for low linewidth garnets is typically in a range of 14 to 16. These materials can be based on Yttrium iron garnet (YIG) with a value of approximately 16, or substituted versions of that chemistry with Aluminum or, for example, Zirconium/Vanadium combinations which can reduce the value to around 14. Although for example Lithium Titanium based spinel ferrites exist with dielectric constants up to close to 20, these generally do not have narrow linewidths; and thus are not suitable for many RF applications.

As described herein, garnets made using Bismuth substituted for Yttrium can have much higher dielectric constants. Also as described herein, when Zirconium is used in tandem with Bismuth substitution to maintain low linewidths, then the dielectric constant of the garnet can increase as shown by way of examples in Table 2.

TABLE 2

| Composition | Dielectric Constant | $4\pi M_s$ (Gauss) | Linewidth (Oersted) | Density (g/cc) |
|---|---|---|---|---|
| $Bi_{0.5}Ca_{0.35}Y_{2.15}Zr_{0.35}Fe_{4.65}O_{12}$ | 18.93 | 1985 | 25 | 5.485 |
| $Bi_{0.9}Ca_{0.35}Y_{1.75}Zr_{0.35}Fe_{4.65}O_{12}$ | 21.35 | 1925 | 67 | 5.806 |
| $Bi_{1.4}Ca_{0.35}Y_{1.25}Zr_{0.35}Fe_{4.65}O_{12}$ | 31.15 | 1857 | 52 | 6.041 |

Table 2 shows that it is possible to more than double the dielectric constant of garnets. In some implementations, an increase in dielectric constant can be maintained for compositions containing Bismuth, including those with other non-magnetic substitution on either or both of the octahedral and tetrahedral sites (e.g., Zirconium or Vanadium, respectively). By using ions of higher polarization, it is possible to further increase the dielectric constant. For example, Niobium or Titanium can be substituted into the octahedral or tetrahedral site; and Titanium can potentially enter both sites.

In some implementations, a relationship between ferrite device size, dielectric constant, and operating frequency can be represented as follows. There are different equations that can characterize different transmission line representations. For example, in above-resonance stripline configurations, the radius R of a ferrite disk can be characterized as $$R = 1.84/[2\pi(\text{effective permeability}) \times (\text{dielectric constant})]^{1/2} \qquad (1)$$

where (effective permeability)=$H_{dc}+4\pi M_s/H_{dc}$, with $H_{dc}$ being the magnetic field bias. Equation 1 shows that, for a fixed frequency and magnetic bias, the radius R is inversely proportional to the square root of the dielectric constant.

In another example, in below-resonance stripline configurations, a relationship for ferrite disk radius R similar to Equation 1 can be utilized for weakly coupled quarter wave circulators where the low bias field corresponds to below-resonance operation. For below-resonance waveguide configurations (e.g., in disk or rod waveguides), both lateral dimension (e.g., radius R) and thickness d of the ferrite can influence the frequency. However, the radius R can still be expressed as $$R = \lambda/[2\pi(\text{dielectric constant})^{1/2}][((\pi R)/(2d))^2+(1.84)^2]^{1/2} \quad (2)$$

which is similar to Equation 1 in terms of relationship between R and dielectric constant.

The example relationship of Equation 2 is in the context of a circular disk shaped ferrites. For a triangular shaped resonator, the same waveguide expression can used, but in this case, A (altitude of the triangle) being equal to 3.63× $\lambda/2\pi$ applies instead of the radius in the circular disk case.

In all of the foregoing example cases, one can see that by increasing the dielectric constant (e.g., by a factor of 2), one can expect to reduce the size of the ferrite (e.g., circular disk or triangle) by a factor of square root of 2, and thereby reduce the area of the ferrite by a factor of 2. As described in reference to Equation 2, thickness of the ferrite can also be reduced.

In implementations where ferrite devices are used as RF devices, sizes of such RF devices can also be reduced. For example, in a stripline device, a footprint area of the device can be dominated by the area of the ferrite being used. Thus, one can expect that a corresponding reduction in device size would be achieved. In a waveguide device, a diameter of the ferrite being used can be a limiting factor in determining size. However, a reduction provided for the ferrite diameter may be offset by the need to retain waveguide-related dimensions in the metal part of the junction.

Examples of Reduced-Size Ferrite Having Yttrium Free Garnet:

As described herein, ferrite size can be reduced significantly by increasing the dielectric constant associated with garnet structures. Also as described herein, garnets with reduced Yttrium and/or reduced non-Y rare earth content can be formed by appropriate Bismuth substitutions. In some embodiments, such garnets can include Yttrium-free or rare earth free garnets. An example RF device having ferrite devices with increased dielectric constant and Yttrium-free garnets is described in reference to FIGS. 15-17.

Figure 15A:
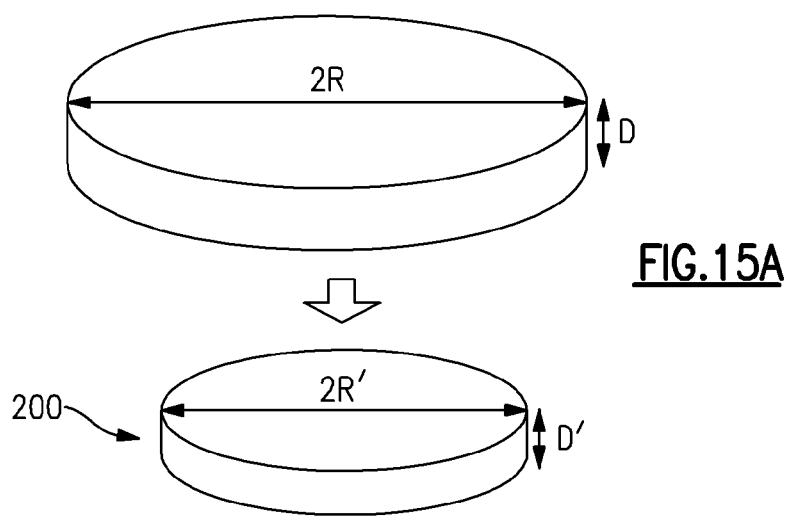
FIGS. 15A and 15B show examples of size reduction that can be implemented for ferrite devices having one or more features as described herein.
Figure 15B:
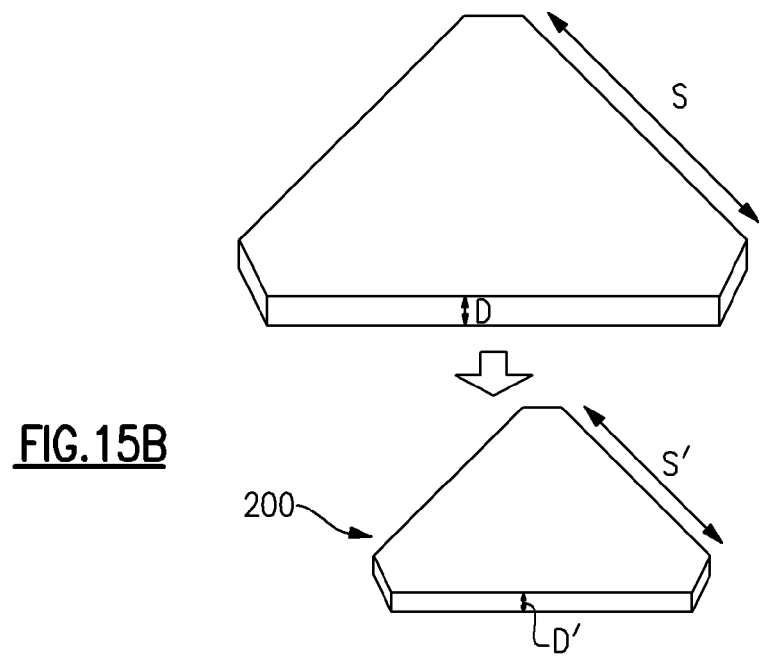

FIGS. 15A and 15B summarize the example ferrite size reductions described herein. As described herein and shown in FIG. 15A, a ferrite device 200 can be a circular-shaped disk having a reduced diameter of 2R' and a thickness of d'. The thickness may or may not be reduced. As described in reference to Equation 1, the radius R of a circular-shaped ferrite disk can be inversely proportional to the square root of the ferrite's dielectric constant. Thus, the increased dielectric constant of the ferrite device 200 is shown to yield its reduced diameter 2R'.

As described herein and shown in FIG. 15B, a ferrite device 200 can also be a triangular-shaped disk having a reduced side dimension of S' and a thickness of d'. The thickness may or may not be reduced. As described in reference to Equation 2, the altitude A of a triangular-shaped ferrite disk (which can be derived from the side dimension S) can be inversely proportional to the square root of the ferrite's dielectric constant. Thus, the increased dielectric constant of the ferrite device 200 is shown to yield its reduced dimension S'.

Although described in the context of example circular and triangle shaped ferrites, one or more features of the present disclosure can also be implemented in other shaped ferrites.

To demonstrate the foregoing effect of the dielectric constant on the operating frequency (and size in some implementations), circulator (sometimes also referred to as an isolator) devices were built. One circulator was built with a current ferrite available as TransTech TTVG1200 (17.56 mm diameter, 1 mm thickness). Another circulator was built with a Yttrium free ferrite with the same dimensions. For the purpose of description, such a Yttrium free ferrite is referred to as "TTHiE1200." Each of the two example circulators has a diameter of about 25 mm.

The TTVG1200 ferrite has a Yttrium Calcium Zirconium Vanadium Iron garnet configuration, and a typical dielectric constant of approximately 14.4. The Yttrium free ferrite (TTHiE1200) has a Bismuth Calcium Zirconium Vanadium Iron garnet configuration containing not more than approximately 1% rare earth oxides, and a dielectric constant of approximately 26.73.

Figure 16A:
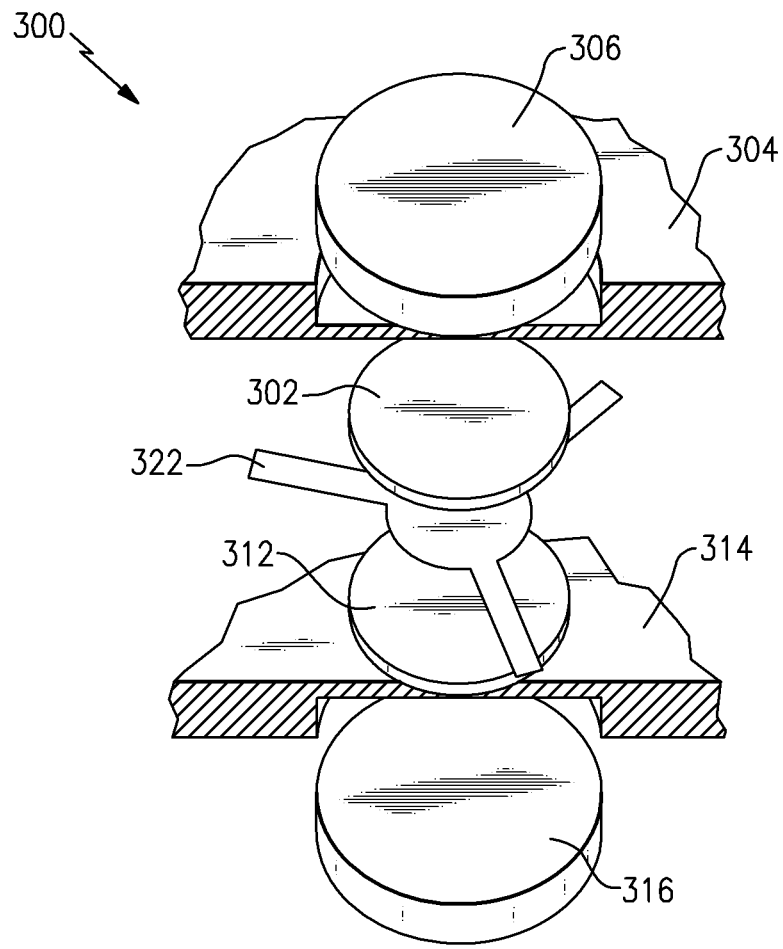
FIGS. 16A and 16B show an example circulator/isolator having ferrite devices as described herein.
Figure 16B:
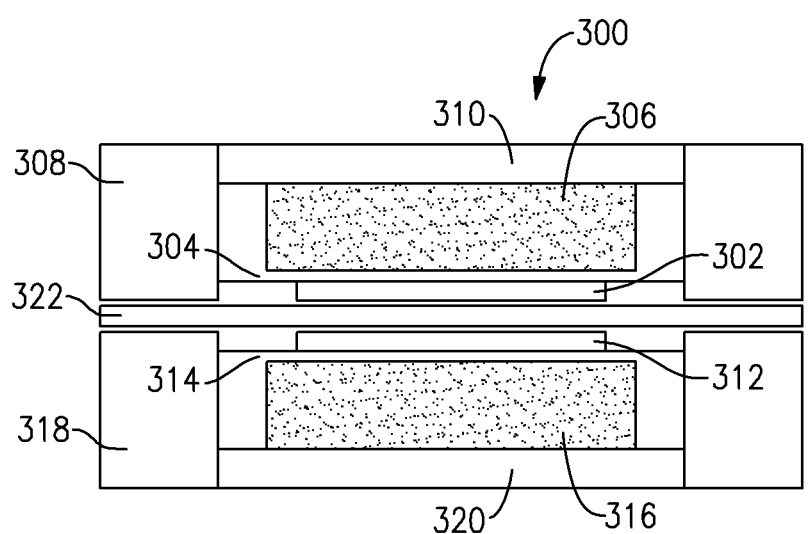

Additional details concerning the foregoing example circulators are described in reference to FIGS. 16A and 16B, in which a "ferrite" can be the first type (TTVG1200) or the second type (TTHiE1200).

FIGS. 16A and 16B show an example of a circulator 300 having a pair of ferrite disks 302, 312 disposed between a pair of cylindrical magnets 306, 316. Each of the ferrite disks 302, 312 can be a ferrite disk having one or more features described herein. FIG. 16A shows an un-assembled view of a portion of the example circulator 300. FIG. 16B shows a side view of the example circulator 300.

In the example shown, the first ferrite disk 302 is shown to be mounted to an underside of a first ground plane 304. An upper side of the first ground plane 304 is shown to define a recess dimensioned to receive and hold the first magnet 306. Similarly, the second ferrite disk 312 is shown to be mounted to an upper side of a second ground plane 314; and an underside of the second ground plane 314 is shown to define a recess dimensioned to receive and hold the second magnet 316.

The magnets 306, 316 arranged in the foregoing manner can yield generally axial field lines through the ferrite disks 302, 312. The magnetic field flux that passes through the ferrite disks 302, 312 can complete its circuit through return paths provided by 320, 318, 308 and 310 so as to strengthen the field applied to the ferrite disks 302, 312. In some embodiments, the return path portions 320 and 310 can be disks having a diameter larger than that of the magnets 316, 306; and the return path portions 318 and 308 can be hollow cylinders having an inner diameter that generally matches the diameter of the return path disks 320, 310. The foregoing parts of the return path can be formed as a single piece or be an assembly of a plurality of pieces.

The example circulator device 300 can further include an inner flux conductor (also referred to herein as a center conductor) 322 disposed between the two ferrite disks 302, 312. Such an inner conductor can be configured to function as a resonator and matching networks to the ports (not shown).

Figure 17:
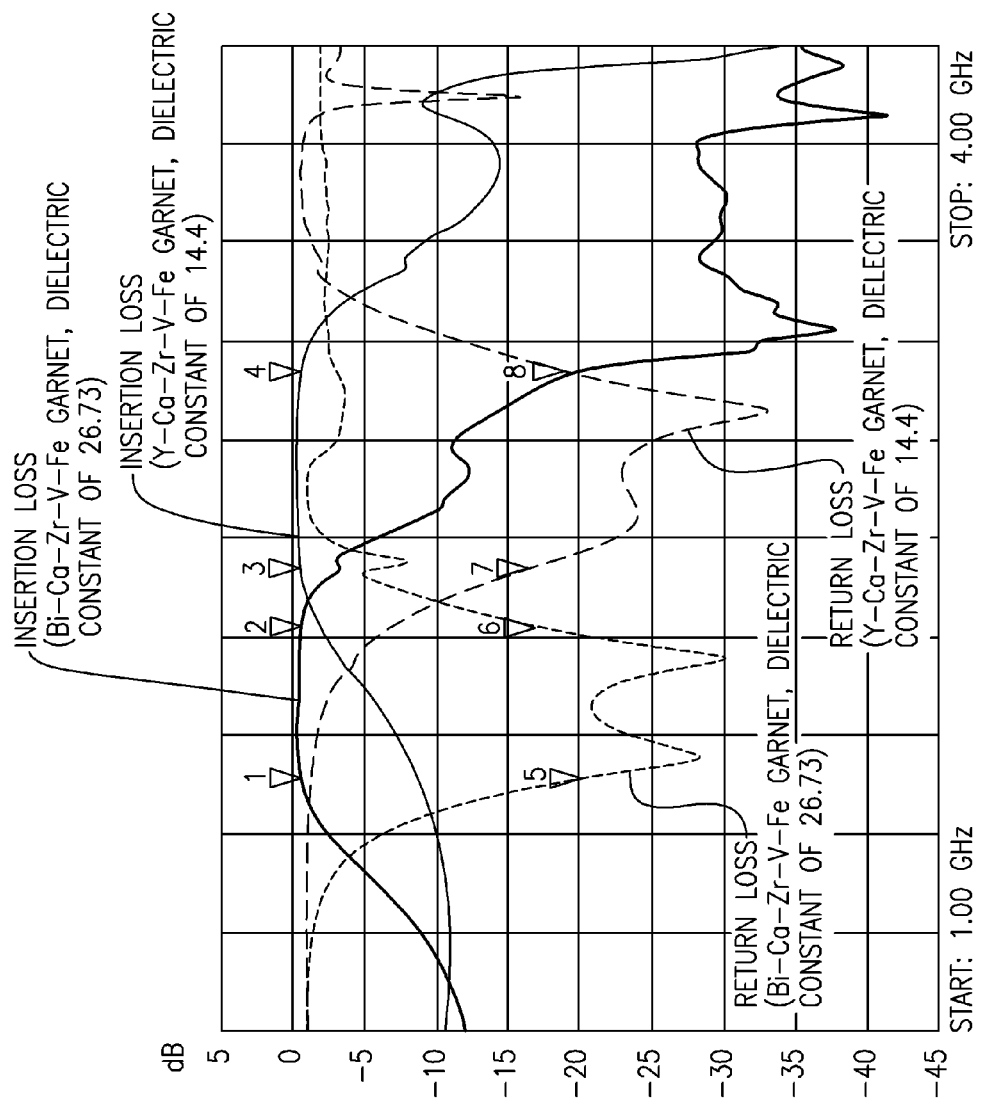
FIG. 17 shows insertion loss plots and return loss plots for two example 25 mm circulators, where one is based on a YCaZrVFe garnet system with dielectric constant of 14.4, and another is based on a Yttrium free BiCaZrVFe garnet system with dielectric constant of 26.73.

FIG. 17 shows insertion loss plots and return loss plots for the two above-described 25 mm circulators (based on the TTVG1200 ferrite (YCaZrVFe garnet, dielectric constant of 14.4), and based on the Yttrium free ferrite (TTHiE1200) (BiCaZrVFe garnet, dielectric constant of 26.73)). Frequencies and loss values for edges of the loss curves of the two circulators ("TTVG1200" and "TTHiE1200") are indicated by their respective trace markers shown in FIG. 17 and listed in Table 3.

TABLE 3

| Marker | Trace | Frequency | Loss value |
|---|---|---|---|
| 1 | Insertion loss (Y-free TTHiE1200) | 1.77 GHz | −0.40 dB |
| 2 | Insertion loss (Y-free TTHiE1200) | 2.23 GHz | −0.39 dB |
| 3 | Insertion loss (TTVG1200) | 2.41 GHz | −0.39 dB |
| 4 | Insertion loss (TTVG1200) | 3.01 GHz | −0.41 dB |
| 5 | Return loss (Y-free TTHiE1200) | 1.77 GHz | −19.87 dB |
| 6 | Return loss (Y-free TTHiE1200) | 2.23 GHz | −16.64 dB |
| 7 | Return loss (TTVG1200) | 2.41 GHz | −16.37 dB |
| 8 | Return loss (TTVG1200) | 3.01 GHz | −18.75 dB |

Based on the foregoing measurements, one can see that the TTVG1200 configuration has a center operating frequency of about 2.7 GHz, and the TTHiE1200 configuration has a center operating frequency of about 2.0 GHz. The ratio of center operating frequencies between TTHiE1200 and TTVG1200 configurations is approximately 0.74. It is noted that a theoretical reduction in frequency due to a higher dielectric constant can be calculated (e.g., using Bosma's equations) as being proportional to square root of the ratios of the dielectric constants. Thus, such a calculation yields sqrt(14.4/26.73)=0.734, which is in good agreement with the measured reduction of 0.74.

For the example 25 mm circulators having the TTHiE1200 and TTVG1200 configurations, a comparison of intermodulation yields the following measurements. For 2×40 W tones at room temperature, the TTVG1200 configuration yields an intermodulation performance of approximately −78 dBc at 2.7 GHz, and the TTHiE1200 configuration yields an intermodulation performance of approximately −70 dBc at 1.8 GHz. It is noted that such results are expected due to the reduction in the biasing magnetic field.

Figure 18A:
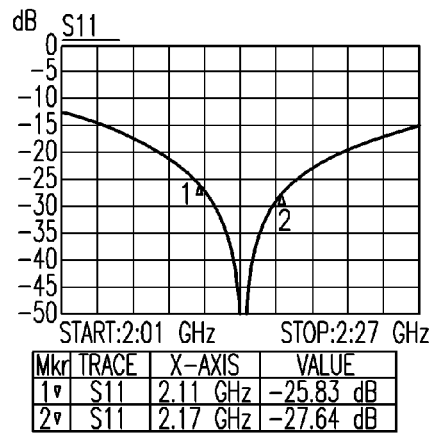
FIGS. 18A and 18B show s-parameter data for an example 10 mm circulator device having the high-dielectric Yttrium free BiCaZrVFe garnet system of FIG. 17.
Figure 18A:
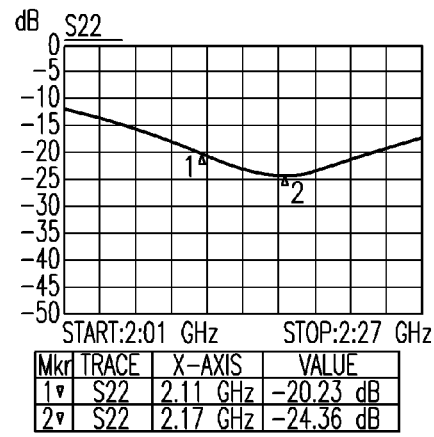
Figure 18A:
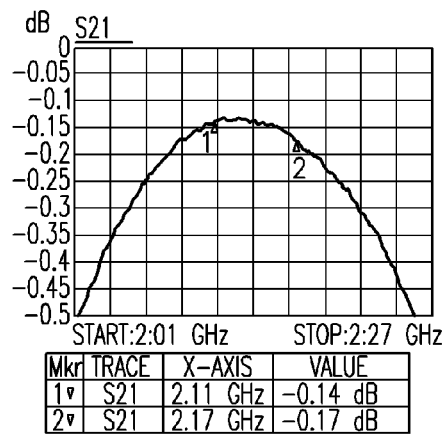
Figure 18A:
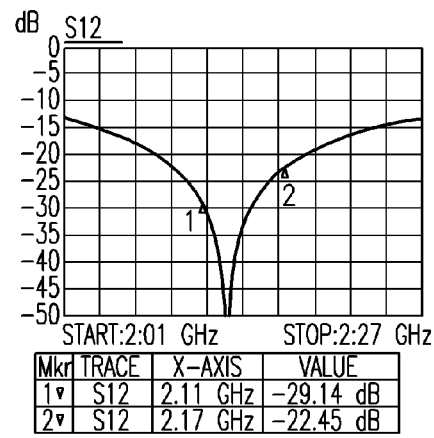
Figure 18B:
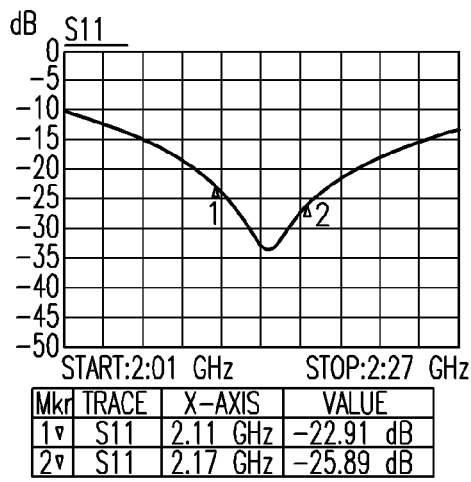
Figure 18B:
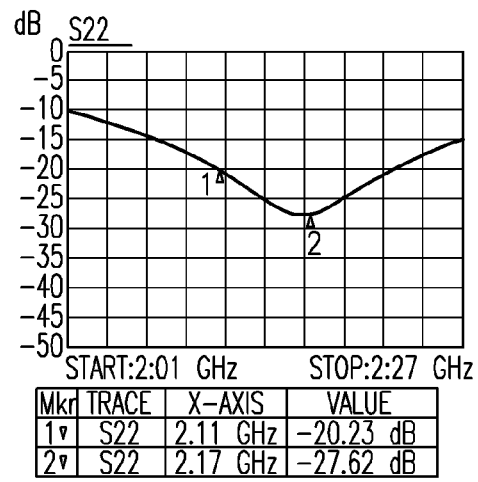
Figure 18B:
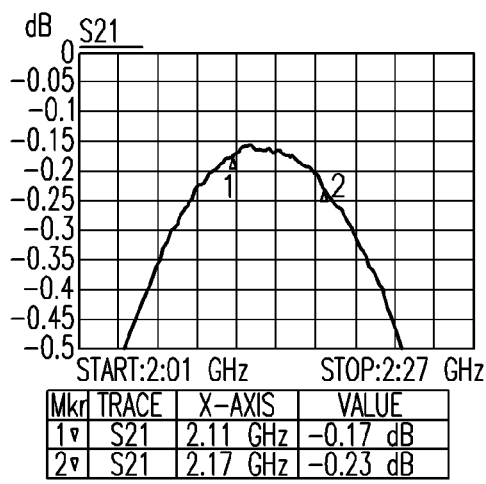
Figure 18B:
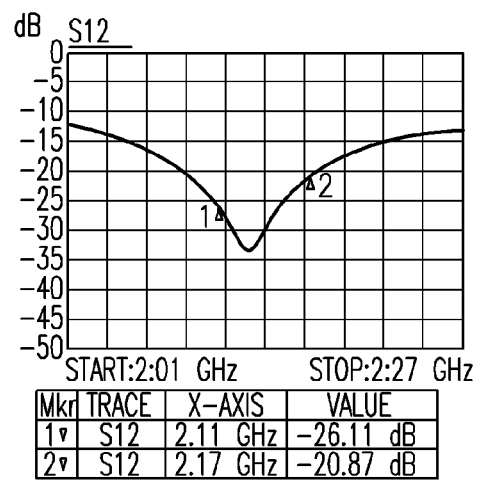

To further characterize the TTHiE1200 ferrite as described herein, a smaller 10 mm circulator was made using a TTHiE1200 ferrite disk (radius of approximately 7.00 mm, thickness of approximately 0.76 mm). FIGS. 18A and 18B show s-parameter data for the 10 mm device at operating temperatures of 25° C. and 100° C., respectively. Intermodulation measurements were also made for the 10 mm device at 25° C. For 2×15 W tones, intermodulation values are listed in Table 4, where various parameters are indicated in the "Parameter" column.

TABLE 4

| Parameter | Intermodulation (dBc) |
|---|---|
| 2 × 15 W @ 2110 & 2115 MHz, 3$^{rd}$ Order IMD @ 2105 MHz | −59.9 |
| 2 × 15 W @ 2110 & 2115 MHz, 3$^{rd}$ Order IMD @ 2120 MHz | −58.8 |
| 2 × 15 W @ 2138 & 2143 MHz, 3$^{rd}$ Order IMD @ 2133 MHz | −57.5 |
| 2 × 15 W @ 2138 & 2143 MHz, 3$^{rd}$ Order IMD @ 2148 MHz | −56.7 |
| 2 × 15 W @ 2165 & 2170 MHz, 3$^{rd}$ Order IMD @ 2160 MHz | −56.0 |
| 2 × 15 W @ 2165 & 2170 MHz, 3$^{rd}$ Order IMD @ 2175 MHz | −54.9 |

Based on FIGS. 18A and 18B, one can see that the s-parameter data appears to be generally positive. Based on Table 4, IMD performance is generally what is expected for this size package. For example, typical IMD performance for a 20 mm device is about −70 dBc, and about −60 dBc for a 15 mm device.

Various examples of new garnet systems and devices related thereto are described herein. In some embodiments, such garnet systems can contain high levels of Bismuth, which can allow formation of low loss ferrite devices. Further, by selected addition of other elements, one can reduce or eliminate rare earth content of garnets, including commercial garnets. Reduction or elimination of such rare earth content can include, but is not limited to, Yttrium. In some embodiments, the garnet systems described herein can be configured to significantly increase (e.g., double) the dielectric constant of non-Bi garnets, thereby offering the possibility of significantly decreasing (e.g., halving) the printed circuit "footprint" of ferrite devices associated with conventional garnets.

In some implementations as described herein, a synthetic garnet material can include a structure having dodecahedral sites, with Bismuth occupying at least some of the dodecahedral sites. In some embodiments, such a garnet material can have a dielectric constant value of at least 18.0, 19.0, 20.0, 21.0, 22.0, 23.0, 24.0, 25.0, 26.0, or 27.0.

Figure 19:
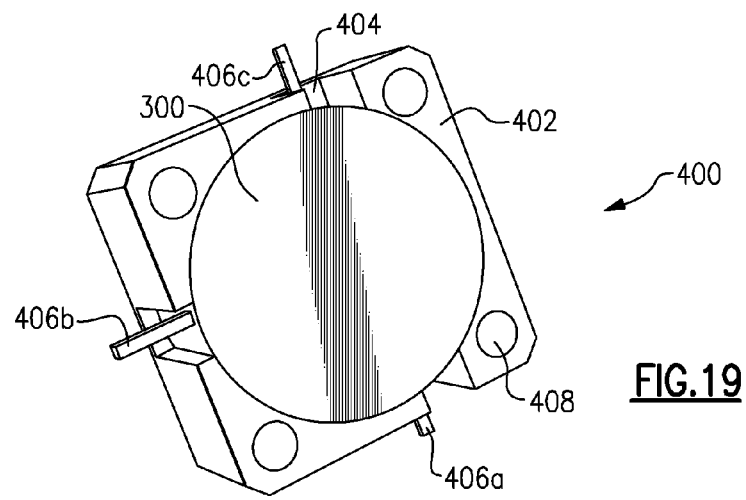
FIG. 19 shows an example of a packaged circulator module.

In some embodiments, ferrite-based circulator devices having one or more features as described herein can be implemented as a packaged modular device. FIG. 19 shows an example packaged device 400 having a circulator device 300 mounted on a packaging platform 404 and enclosed by a housing structure 402. The example platform 404 is depicted as including a plurality of holes 408 dimensioned to allow mounting of the packaged device 400. The example packaged device 400 is shown further include example terminals 406a-406c configured to facilitate electrical connections.

In some embodiments, a packaged circulator/isolator such as the example of FIG. 19 can be implemented in a circuit board or module. Such a circuit board can include a plurality of circuits configured to perform one or more radio-frequency (RF) related operations. The circuit board can also include a number of connection features configured to allow transfer of RF signals and power between the circuit board and components external to the circuit board.

Figure 20:
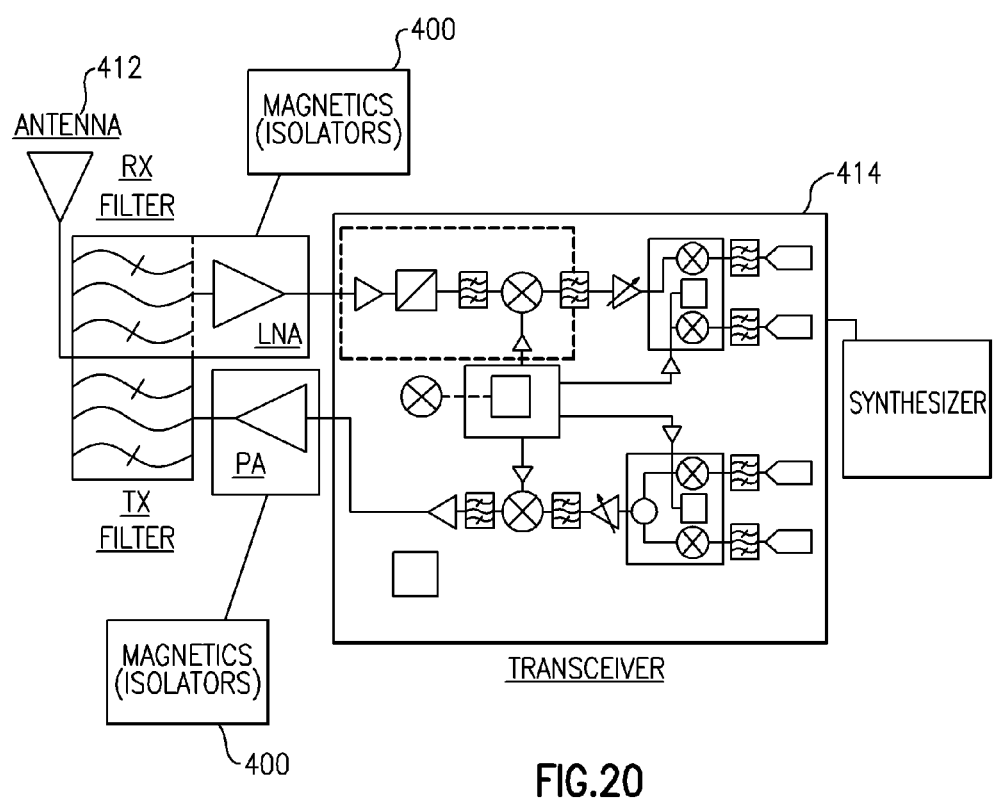
FIG. 20 shows an example RF system where one or more of circulator/isolator devices as described herein can be implemented.

In some embodiments, the foregoing example circuit board can include RF circuits associated with a front-end module of an RF apparatus. As shown in FIG. 20, such an RF apparatus can include an antenna 412 that is configured to facilitate transmission and/or reception of RF signals. Such signals can be generated by and/or processed by a transceiver 414. For transmission, the transceiver 414 can generate a transmit signal that is amplified by a power amplifier (PA) and filtered (Tx Filter) for transmission by the antenna 412. For reception, a signal received from the antenna 412 can be filtered (Rx Filter) and amplified by a low-noise amplifier (LNA) before being passed on to the transceiver 414. In the example context of such Tx and Rx paths, circulators and/or isolators 400 having one or more features as described herein can be implemented at or in connection with, for example, the PA circuit and the LNA circuit.

In some embodiments, circuits and devices having one or more features as described herein can be implemented in RF applications such as a wireless base-station. Such a wireless base-station can include one or more antennas 412, such as the example described in reference to FIG. 20, configured to facilitate transmission and/or reception of RF signals. Such antenna(s) can be coupled to circuits and devices having one or more circulators/isolators as described herein.

As described herein, terms "circulator" and "isolator" can be used interchangeably or separately, depending on applications as generally understood. For example, circulators can be passive devices utilized in RF applications to selectively route RF signals between an antenna, a transmitter, and a receiver. If a signal is being routed between the transmitter and the antenna, the receiver preferably should be isolated. Accordingly, such a circulator is sometimes also referred to as an isolator; and such an isolating performance can represent the performance of the circulator.

FIGS. 21-25 show examples of how ferrite devices having one or more features as described herein can be fabricated. FIG. 16 shows a process 20 that can be implemented to fabricate a ceramic material having one or more of the foregoing properties. In block 21, powder can be prepared. In block 22, a shaped object can be formed from the prepared powder. In block 23, the formed object can be sintered. In block 24, the sintered object can be finished to yield a finished ceramic object having one or more desirable properties.

In implementations where the finished ceramic object is part of a device, the device can be assembled in block 25. In implementations where the device or the finished ceramic object is part of a product, the product can be assembled in block 26.

Figure 21:
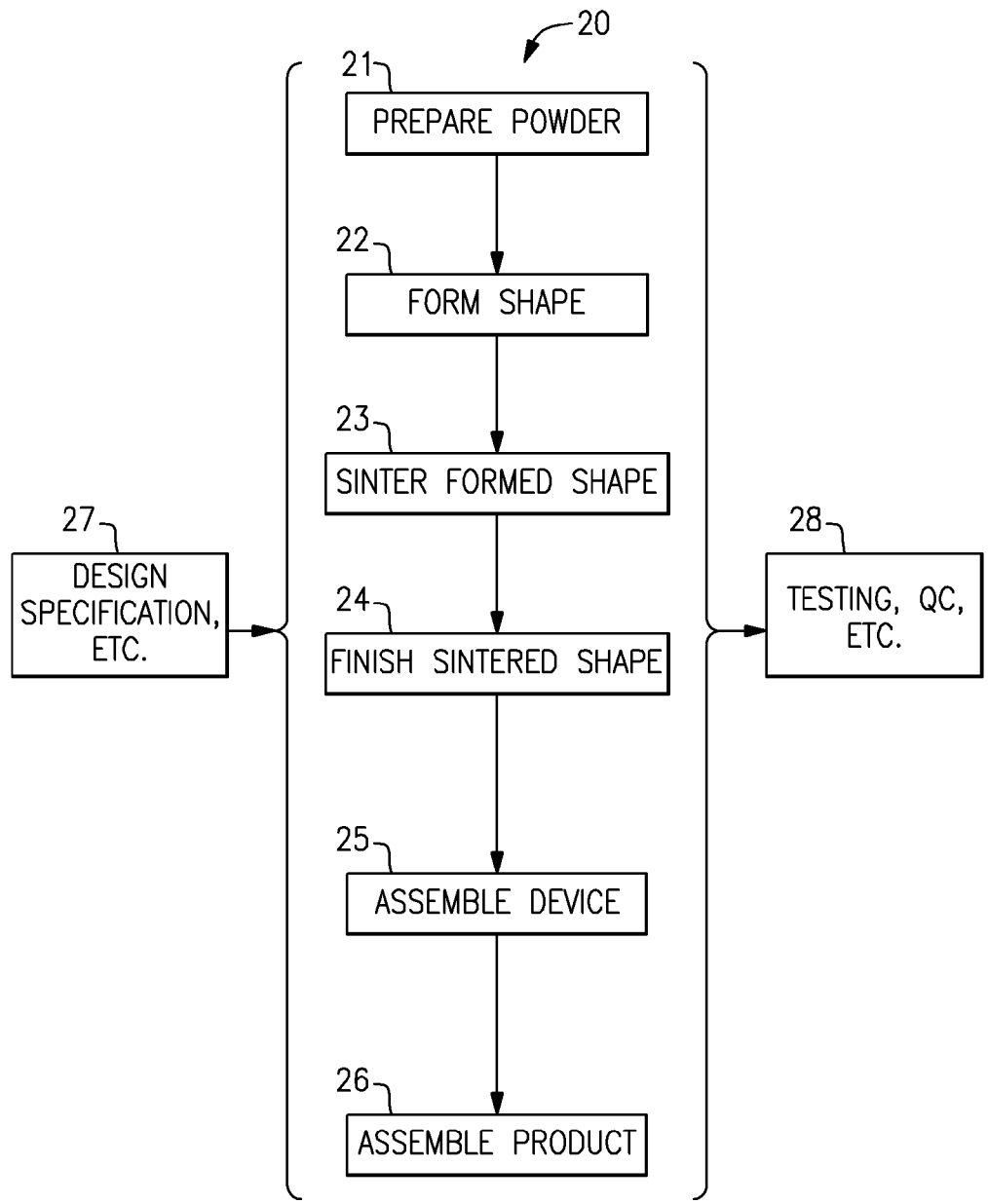
FIG. 21 shows a process that can be implemented to fabricate a ceramic material having one or more features as described herein.

FIG. 21 further shows that some or all of the steps of the example process 20 can be based on a design, specification, etc. Similarly, some or all of the steps can include or be subjected to testing, quality control, etc.

In some implementations, the powder preparation step (block 21) of FIG. 21 can be performed by the example process described in reference to FIG. 14. Powder prepared in such a manner can include one or more properties as described herein, and/or facilitate formation of ceramic objects having one or more properties as described herein.

Figure 22:
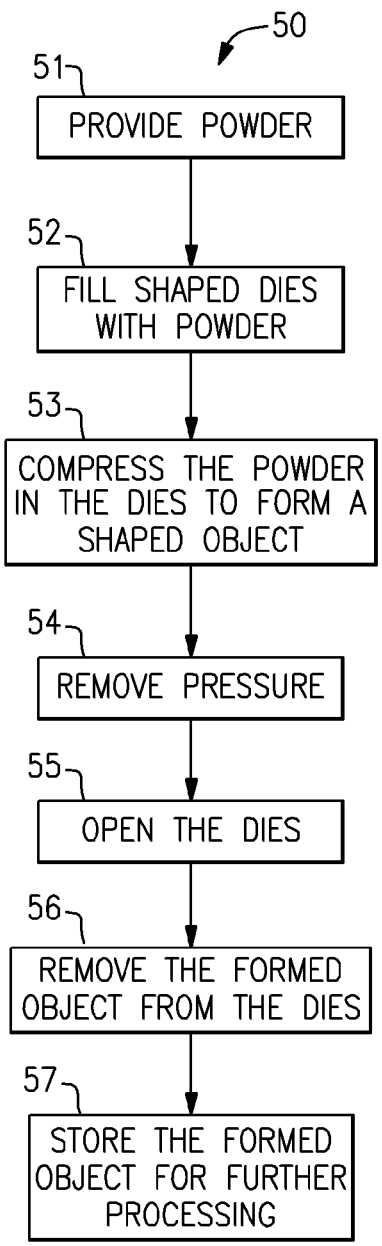
FIG. 22 shows a process that can be implemented to form a shaped object from powder material described herein.
Figure 23:
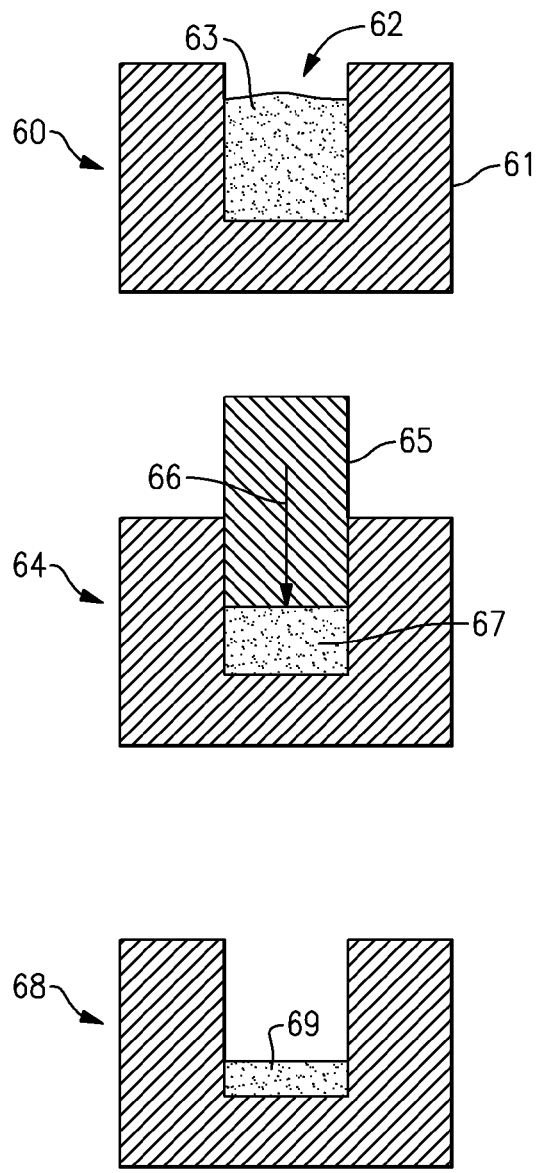
FIG. 23 shows examples of various stages of the process of FIG. 22.

In some implementations, powder prepared as described herein can be formed into different shapes by different forming techniques. By way of examples, FIG. 22 shows a process 50 that can be implemented to press-form a shaped object from a powder material prepared as described herein. In block 52, a shaped die can be filled with a desired amount of the powder. In FIG. 23, configuration 60 shows the shaped die as 61 that defines a volume 62 dimensioned to receive the powder 63 and allow such power to be pressed. In block 53, the powder in the die can be compressed to form a shaped object. Configuration 64 shows the powder in an intermediate compacted form 67 as a piston 65 is pressed (arrow 66) into the volume 62 defined by the die 61. In block 54, pressure can be removed from the die. In block 55, the piston (65) can be removed from the die (61) so as to open the volume (62). Configuration 68 shows the opened volume (62) of the die (61) thereby allowing the formed object 69 to be removed from the die. In block 56, the formed object (69) can be removed from the die (61). In block 57, the formed object can be stored for further processing.

Figure 24:
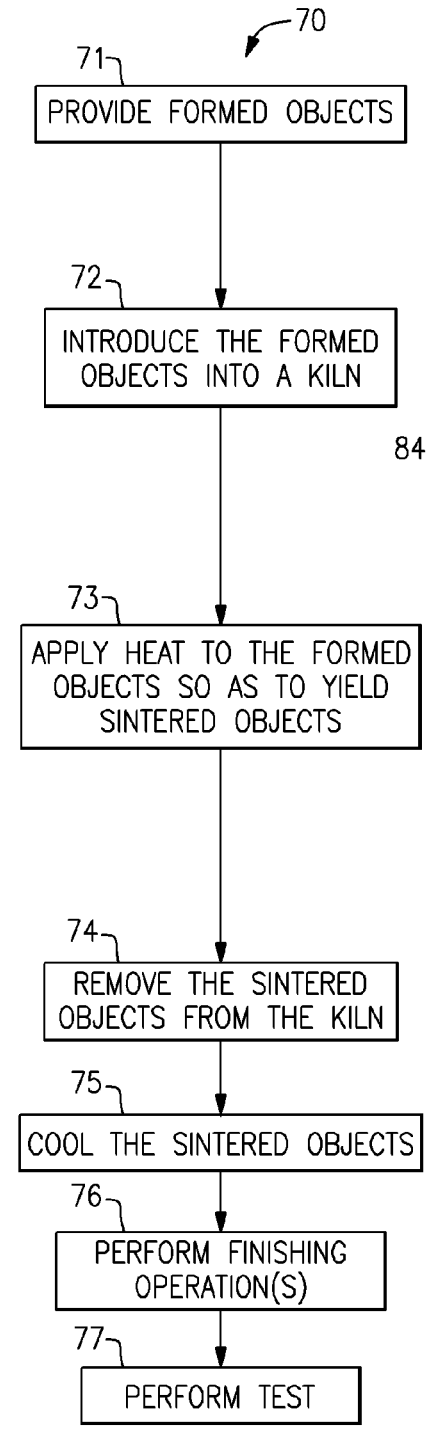
FIG. 24 shows a process that can be implemented to sinter formed objects such as those formed in the example of FIGS. 22 and 23.
Figure 25:
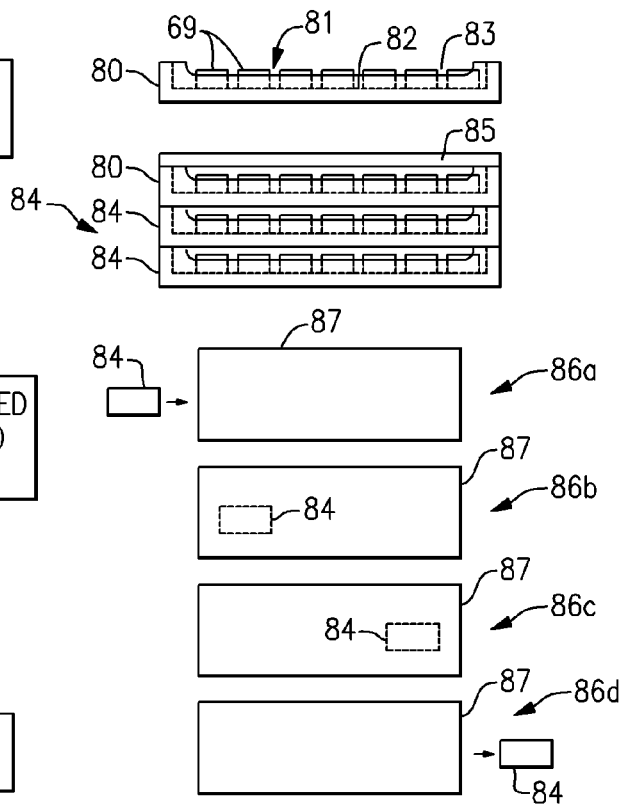
FIG. 25 shows examples of various stages of the process of FIG. 24.

In some implementations, formed objects fabricated as described herein can be sintered to yield desirable physical properties as ceramic devices. FIG. 24 shows a process 70 that can be implemented to sinter such formed objects. In block 71, formed objects can be provided. In block 72, the formed objects can be introduced into a kiln. In FIG. 25, a plurality of formed objects 69 are shown to be loaded into a sintering tray 80. The example tray 80 is shown to define a recess 83 dimensioned to hold the formed objects 69 on a surface 82 so that the upper edge of the tray is higher than the upper portions of the formed objects 69. Such a configuration allows the loaded trays to be stacked during the sintering process. The example tray 80 is further shown to define cutouts 83 at the side walls to allow improved circulation of hot gas at within the recess 83, even when the trays are stacked together. FIG. 25 further shows a stack 84 of a plurality of loaded trays 80. A top cover 85 can be provided so that the objects loaded in the top tray generally experience similar sintering condition as those in lower trays.

In block 73, heat can be applied to the formed objects so as to yield sintered objects. Such application of heat can be achieved by use of a kiln. In block 74, the sintered objects can be removed from the kiln. In FIG. 25, the stack 84 having a plurality of loaded trays is depicted as being introduced into a kiln 87 (stage 86a). Such a stack can be moved through the kiln (stages 86b, 86c) based on a desired time and temperature profile. In stage 86d, the stack 84 is depicted as being removed from the kiln so as to be cooled.

In block 75, the sintered objects can be cooled. Such cooling can be based on a desired time and temperature profile. In block 206, the cooled objects can undergo one or more finishing operations. In block 207, one or more tests can be performed.

Heat treatment of various forms of powder and various forms of shaped objects are described herein as calcining, firing, annealing, and/or sintering. It will be understood that such terms may be used interchangeably in some appropriate situations, in context-specific manners, or some combination thereof.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A modified garnet structure comprising:
   a bismuth-doped garnet represented by the formula $Bi_{3-x}(Ca)_xFe_{2-y}(Me)_yFe_{3-z}(Me')_zO_{12}$, x being greater than or equal to 1.6 and less than or equal to 2.0, , y being greater than or equal to 0.35 and less than or equal to 0.75, z being greater than 0 and less than or equal to 0.525, and each of Me and Me' representing a metal element.

2. The modified garnet structure of claim 1 wherein the dielectric constant value is at least 21.

3. The modified garnet structure of claim 1 wherein the dielectric constant value is at least 27.

4. The modified garnet structure of claim 1 wherein the metal element Me includes Zr.

5. The modified garnet structure of claim 1 wherein the metal element Me' includes V.

6. The modified garnet structure of claim 1 wherein the bismuth-doped garnet is substantially free of rare earth elements.

7. The modified garnet structure of claim 1 wherein the garnet material has a ferrimagnetic resonance linewidth value that is less than 12 Oersted.

8. A modified garnet structure comprising:
   a bismuth-doped garnet represented by the formula $Bi_{1.4}Ca_{1.6}Zr_{0.55}V_{0.525}Fe_{3.925}O_{12}$, the bismuth-doped garnet material having a dielectric constant value of at least 21.

9. The modified garnet structure of claim 8 wherein the bismuth-doped garnet has a dielectric constant value of at least 27.

10. The modified garnet structure of claim 8 wherein the garnet material has a ferrimagnetic resonance linewidth value that is less than 12 Oersted.

11. A radiofrequency system comprising:
    at least one circulator including a bismuth-doped garnet material represented by the formula $Bi_{3-x}(Ca)_xFe_{2-y}(Me)_yFe_{3-z}(ME')_zO_{12}$, x being greater than or equal to 1.6 and less than or equal to 2.0, y being greater than or equal to 0.35 and less than or equal to 0.75, z being greater than or equal to 0 and less than or equal to 0.525, and each of Me and Me' representing a metal element.

12. The radiofrequency device of claim 11 wherein the circulator is incorporated into an antenna.

13. The radiofrequency device of claim 11 wherein the system is a base station.

14. The radiofrequency device of claim 11 wherein the bismuth-doped garnet material has a dielectric constant value of at least 21.

15. The radiofrequency device of claim 11 wherein the dielectric constant value is at least 27.

16. The radiofrequency device of claim 11 wherein the metal element Me includes Zr.

17. The radiofrequency device of claim 11 wherein the metal element Me' includes V.

18. The radiofrequency device of claim 11 wherein the bismuth-doped garnet is substantially free of rare earth elements.

19. The radiofrequency device of claim 11 wherein the garnet material has a ferrimagnetic resonance linewidth value that is less than 12 Oersted.

20. The radiofrequency device of claim 11 wherein garnet material has a composition $Bi_{1.4}Ca_{1.6}Zr_{0.55}V_{0.525}Fe_{3.925}O_{12}$.

* * * * *

UNITED STATES PATENT AND TRADEMARK OFFICE
CERTIFICATE OF CORRECTION

PATENT NO. : 10,230,146 B2
APPLICATION NO. : 15/003446
DATED : March 12, 2019
INVENTOR(S) : David Bowie Cruickshank et al.

It is certified that error appears in the above-identified patent and that said Letters Patent is hereby corrected as shown below:

In the Claims

Column 23, Line 23, in Claim 1, change "2.0, ," to --2.0,--.

Signed and Sealed this
Eighteenth Day of June, 2019

Andrei Iancu
*Director of the United States Patent and Trademark Office*